US 6,658,039 B2

(12) United States Patent
Numai

(10) Patent No.: US 6,658,039 B2
(45) Date of Patent: Dec. 2, 2003

(54) RING LASER AND METHOD FOR DRIVING A RING LASER

(75) Inventor: Takahiro Numai, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 150 days.

(21) Appl. No.: 09/900,950

(22) Filed: Jul. 10, 2001

(65) Prior Publication Data

US 2002/0021732 A1 Feb. 21, 2002

(30) Foreign Application Priority Data

Jul. 12, 2000 (JP) ........................................ 2000-211852

(51) Int. Cl.[7] .................... H01S 3/083; G01C 19/64; G01C 19/66; G01C 19/72
(52) U.S. Cl. ...................... 372/94; 356/459; 356/461
(58) Field of Search ...................... 372/94, 92; 356/459, 356/461

(56) References Cited

U.S. PATENT DOCUMENTS

| 4,431,308 | A | | 2/1984 | Mitsuhashi et al. ......... 356/350 |
| 4,747,111 | A | * | 5/1988 | Trutna, Jr. et al. ............ 372/94 |
| 4,913,548 | A | | 4/1990 | Vick ........................... 356/350 |
| 5,398,256 | A | * | 3/1995 | Hohimer et al. .............. 372/94 |
| 5,764,681 | A | | 6/1998 | Ballantyne et al. ........... 372/94 |

FOREIGN PATENT DOCUMENTS

| JP | 04-174317 | 6/1992 |
| JP | 05-288556 | 11/1993 |

* cited by examiner

Primary Examiner—Quyen Leung
Assistant Examiner—James Menefee
(74) Attorney, Agent, or Firm—Fitzpatrick, Cella, Harper & Scinto

(57) ABSTRACT

A ring laser of the present invention includes multiple ring resonators with different optical path lengths, wherein at least part of the multiple ring resonators is optically coupled, and a propagating direction of laser light propagating in the ring resonators is not reversed by the coupling.

22 Claims, 15 Drawing Sheets

RING LASER AND METHOD FOR DRIVING A RING LASER

BACKGROUND OF THE INVENTION

1. Field of the Invention

The present invention relates to a laser. In particular, the present invention relates to a ring laser and a ring laser type optical gyro for detecting rotation.

2. Related Background Art

A gyro is a sensor for detecting an angular velocity of a moving object. The gyro can be used for controlling the posture of an aircraft and a robot, detecting the position in car navigation, detecting sideways sliding of a car, preventing hand-shaking of a silver-salt camera, a digital camera, and a video camera, etc.

As a gyro, a mechanical gyro provided with a rotor and an oscillator, and an optical gyro are known. In particular, the optical gyro is capable of performing instantaneous start-up and has a large dynamic range, so that the optical gyro is bringing about innovation in the field of a gyro technique. Examples of the optical gyro include a ring laser type gyro, an optical fiber gyro, and a passive ring resonator gyro. Among them, the development of the ring laser type gyro using a gas laser was first launched, and it has already been put into practical use in an aircraft and the like. Recently, as a small ring laser type gyro with high precision, a semiconductor laser gyro integrated on a semiconductor substrate is also proposed. For example, Japanese Patent Application Laid-Open No. High 5-288556 describes this type of gyro. In this manner, a ring laser is important in terms of application to a gyro. In order to increase a signal/noise ratio as a gyro, it is desirable to minimize the number of oscillation modes.

However, in a conventional ring laser type gyro, restriction of the number of oscillation modes has not been studied well. In particular, a semiconductor laser has a large gain bandwidth (i.e., about 10 nm), so that a resonant mode in this bandwidth may oscillate. That is, a semiconductor ring laser is likely to oscillate in a multi-mode. In order to restrict the number of oscillation modes, the number of resonant modes present in the gain bandwidth may be decreased. However, a resonant optical filter such as a Fabry-perot resonator and a diffraction grating cannot be used for the following reason. If a resonant optical filter is used, a forward running wave and a backward running wave are coupled, and the coupling strength of counterpropagating laser lights becomes strong; as a result, the oscillation of one mode is suppressed. This phenomenon is known as lock-in, which causes a problem particularly in the case where the difference in oscillation frequency of counterpropagating laser lights is small (e.g., in the case where the rotation speed is small). Therefore, there is a demand for a ring laser capable of restricting the number of oscillation modes under the condition that a forward running wave and a backward running wave are not coupled.

SUMMARY OF THE INVENTION

Therefore, with the foregoing in mind, it is an object of the present invention to provide a ring laser and a ring laser type gyro capable of restricting the number of oscillation modes so as not to cause lock-in.

In order to solve the above-mentioned problem, according to a first aspect of the present invention, a ring laser includes multiple paths with different optical path lengths, wherein at least part of the multiple paths is optically coupled, and a propagating direction of laser light propagating in an optical resonator is not reversed by the multiple paths.

In order to achieve the above-mentioned object, according to a second aspect of the present invention, in the first aspect of the invention, a ring laser has a structure such that counterpropagating laser lights having different oscillation frequencies are present in an optical resonator.

In order to achieve the above-mentioned object, according to a third aspect of the present invention, in the second aspect of the invention, a ring laser has a structure such that at least part of the multiple paths is provided with a mechanism for giving a loss difference or a net gain difference with respect to the laser lights counterpropagating in an optical resonator.

In order to achieve the above-mentioned object, according to a fourth aspect of the present invention, in the third aspect of the invention, a ring laser has a structure such that the mechanism for giving a loss difference or a net gain difference with respect to the laser lights counterpropagating in the optical resonator is a taper-shaped optical waveguide having an asymmetric shape.

In order to achieve the above-mentioned object, according to a fifth aspect of the present invention, in the third aspect of the invention, a ring laser has a structure such that the mechanism for giving a loss difference or a net gain difference with respect to the laser lights counterpropagating in the optical resonator is composed of an optical component including a polarizer.

In order to achieve the above-mentioned object, according to a sixth aspect of the present invention, in any one of the above aspects 1 to 5, a ring laser includes multiple electrodes capable of electrically and independently controlling at least part of the multiple paths.

In order to achieve the above-mentioned object, according to a seventh aspect of the present invention, in the first aspect of the invention, a ring laser has a structure such that only laser lights propagating in one propagating direction is present in the optical resonator.

In order to achieve the above-mentioned object, according to an eighth aspect of the present invention, in the seventh aspect of the invention, a ring laser has a structure such that at least part of the multiple paths is provided with a mechanism for giving a loss difference or a net gain difference with respect to laser lights counterpropagating in the optical resonator.

In order to achieve the above-mentioned object, according to a ninth aspect of the present invention, in the seventh aspect of the invention, a ring laser has a structure such that the mechanism for giving a loss difference or a net gain difference with respect to laser lights counterpropagating in the optical resonator is a taper-shaped optical waveguide.

In order to achieve the above-mentioned object, according to a tenth aspect of the present invention, in the seventh aspect of the invention, a ring laser has a structure such that the mechanism for giving a loss difference or a net gain difference with respect to laser lights counterpropagating in the optical resonator is composed of an optical component including a polarizer.

In order to achieve the above-mentioned object, according to an eleventh aspect of the present invention, in any one of the above aspects 7 to 10 of the present invention, a ring laser includes multiple electrodes capable of electrically and independently controlling at least part of the multiple paths.

In order to achieve the above-mentioned object, according to a twelfth aspect of the present invention, in a method for driving a ring laser, at least part of the multiple electrodes is electrically and independently controlled.

In order to achieve the above-mentioned object, according to a thirteenth aspect of the present invention, a gyro apparatus includes: a ring laser in any one of the aspects 1 to 6 of the invention; a power source of driving of the ring laser; an apparatus for measuring a difference in oscillation frequencies of laser lights; and an apparatus for controlling the power source of driving in accordance with the difference in oscillation frequency.

In order to achieve the above-mentioned object, according to a fourteenth aspect of the present invention, in the thirteenth aspect of the invention, a gyro apparatus includes an apparatus for measuring the difference in oscillation frequencies of laser lights counterpropagating in an optical resonator from a change in a current, a voltage, or impedance of the ring laser.

In order to achieve the above-mentioned object, according to a fifteenth aspect of the present invention, in the thirteenth aspect in the invention, a gyro apparatus includes: a photodetector for simultaneously receiving laser lights counterpropagating in the optical resonator; and an apparatus for measuring the difference in oscillation frequencies of the laser lights from an output of the photodetector.

In order to achieve the above-mentioned object, according to a thirteenth aspect of the present invention, a gyro apparatus includes: an apparatus for measuring the difference in oscillation frequencies of laser lights counterpropagating in the optical resonator from a change in a current, a voltage, or impedance of the ring laser; a photodetector for simultaneously receiving the laser lights counterpropagating in the optical resonator; and an apparatus for measuring the difference in oscillation frequencies of the laser lights from an output of the photodetector.

In order to achieve the above-mentioned object, according to a seventeenth aspect of the present invention, in any one of the above aspects 13 to 16 of the invention, a gyro apparatus includes a frequency-voltage conversion circuit.

In order to achieve the above-mentioned object, according to an eighteenth aspect of the present invention, in any one of the above aspects 13 to 16 of the invention, a gyro apparatus includes a frequency counter.

In order to achieve the above-mentioned object, according to a nineteenth aspect of the present invention, a method for driving a gyro apparatus controls the power source of driving so that the difference in oscillation frequencies of the laser lights becomes constant while the gyro apparatus in any one of the above aspects 13 to 18 stands still.

In order to achieve the above-mentioned object, according to a twentieth aspect of the present invention, a method for driving a gyro apparatus controls the power source of driving so that the difference in oscillation frequencies of the laser lights becomes constant while the gyro apparatus in any one of the aspects 13 to 18 is rotated.

In order to achieve the above-mentioned object, according to a twenty-first aspect of the present invention, in any one of the above aspects 19 to 20 of the invention, the power source of driving supplies an electric power to multiple electrodes of the ring laser.

In order to achieve the above-mentioned object, according to a twenty-second aspect of the present invention, in the twenty-first aspect of the invention, the power source of driving supplies an electric power to at least part of the multiple electrodes of the ring laser so that the electrodes are electrically independent of each other.

In order to achieve the above-mentioned object, according to a signal detection method of a gyro apparatus of a twenty-third aspect of the present invention, in the gyro apparatus of any one of the above aspects 13 to 18, at least one of a change in a current, a voltage or impedance of the ring laser, an output of the photodetector, a signal for controlling the power source of driving, and an output current or an output voltage of the power source of driving is used as an output signal of a gyro.

In order to achieve the above-mentioned object, according to a signal detection method of a gyro apparatus of a twenty-fourth aspect of the present invention, in the twenty-third aspect of the invention, multiple signals of a change in a current, a voltage or impedance of the ring laser, an output of the photodetector, a signal for controlling the power source of driving, and an output current or an output voltage of the power source of driving are subjected to statistical processing, and an obtained signal is used as an output signal of a gyro.

In order to achieve the above-mentioned object, according to a twenty-fifth aspect of the present invention, a ring waveguide of a ring laser includes a connecting waveguide for optical coupling at least two portions of the ring waveguide.

In order to achieve the above-mentioned object, according to a twenty-sixth aspect of the present of the invention, a ring waveguide includes an asymmetric taper portion, and the connecting waveguide is optically coupled to the ring waveguide in a portion other than the asymmetric taper portion.

In order to achieve the above-mentioned object, according to a twenty-seventh aspect of the present invention, in a ring waveguide, the asymmetric taper portion has a portion protruding at a right angle from one point of a side wall of the ring waveguide.

In order to achieve the above-mentioned object, according to a twenty-eighth aspect of the present invention, a ring waveguide includes an asymmetric taper portion, wherein a part of the asymmetric taper portion is a non-waveguide region that does not guide laser light, and the non-waveguide region does not cross the asymmetric taper portion or a side wall of the ring waveguide.

In order to achieve the above-mentioned object, according to a twenty-ninth aspect of the present invention, in a ring waveguide, the asymmetric taper portion has a portion protruding at a right angle from one point of a side wall of the ring waveguide.

DESCRIPTION OF THE PREFERRED EMBODIMENTS

The ring laser of the present invention is capable of detecting a beat signal when standing still, and includes a first ring resonator having a first optical path and a second ring resonator having a second optical path, wherein the second optical path shares its part with the first optical path, and the first and second optical paths are different in optical path length from each other.

Hereinafter, embodiments of the present invention will be described in detail with reference to the drawings.

Figure 1:
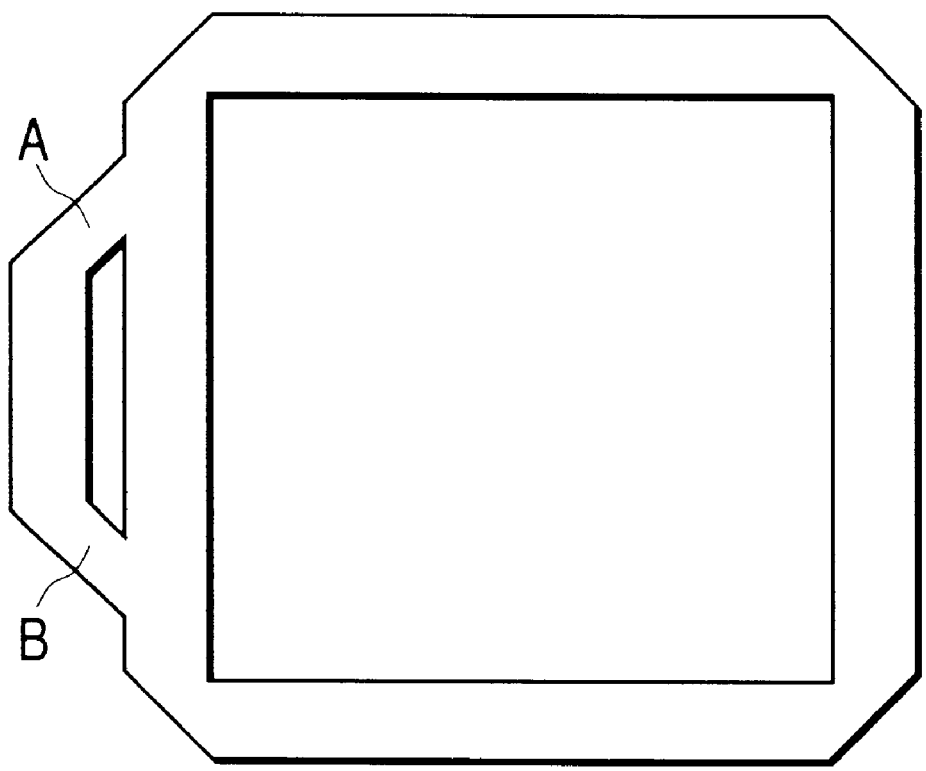
FIG. 1 is a view illustrating a ring laser and a ring laser type gyro of the first example according to the present invention.

FIG. 1 is a plan view of a ring resonator laser, for illustrating how a resonant mode is determined. An inner path (length of one round: $d_3$) and an outer path (length of one round: $d_4 > d_3$) are coupled to each other at points A and B. In FIG. 1, the inner path and the outer path are optically coupled at two positions so that laser light propagates through a common path as much as possible. If the number of common paths is increased, the amount of an injection current to the device may become small.

Figure 2A:
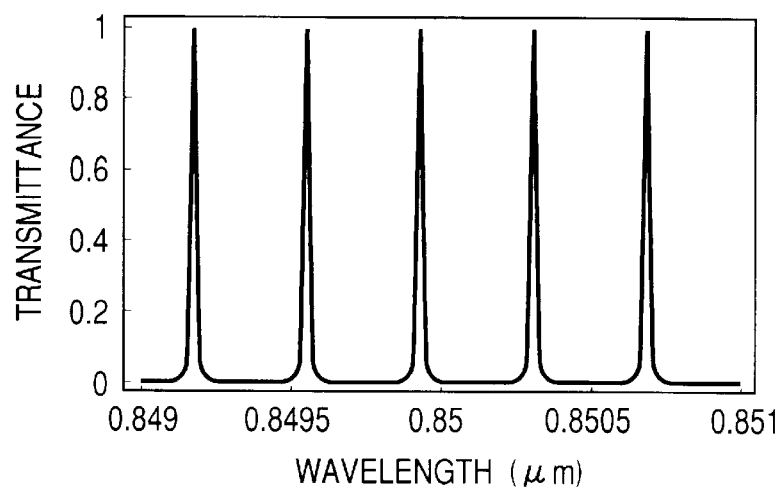
FIGS. 2A, 2B, and 2C are views illustrating resonant modes of the ring laser of the first example according to the present invention.
Figure 2B:
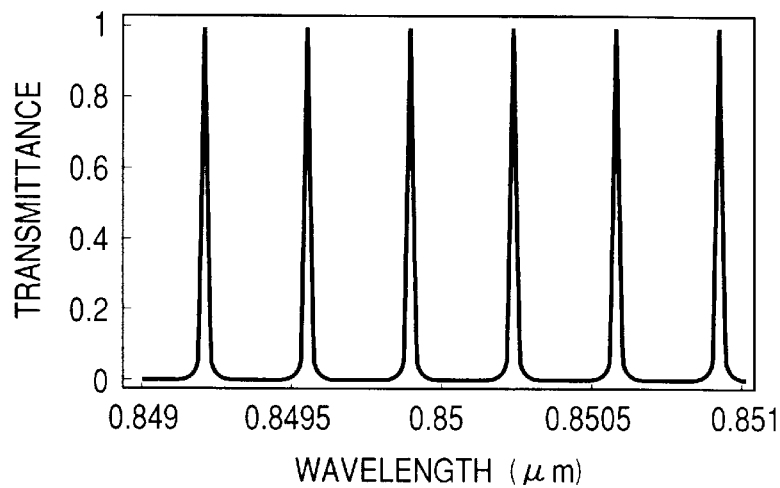

Assuming that an effective refractive index of the path is $n_{eff}$, a resonant wavelength $\lambda_3$ with respect to the inner path and a resonant wavelength $\lambda_4$ with respect to the outer path are represented by $\lambda_3 = n_{eff} d_3/m_3$ and $\lambda_4 = n_{eff} d_4/m_4$, respectively. Herein, $m_3$ and $m_4$ are positive integers. FIGS. 2A and 2B show resonant characteristics with respect to $d_3 = 600$ $\mu$m and $d_4 = 660$ $\mu$m when the effective refractive index $n_{eff}$ is 3.2.

In FIGS. 2A and 2B, a horizontal axis represents a wavelength and a vertical axis represents a power transmittance of a ring resonator. It is understood from these figures that multiple resonant peaks with the same transmittance are present, and intervals of a resonant mode are slightly shifted from each other in FIGS. 2A and 2B.

Figure 2C:
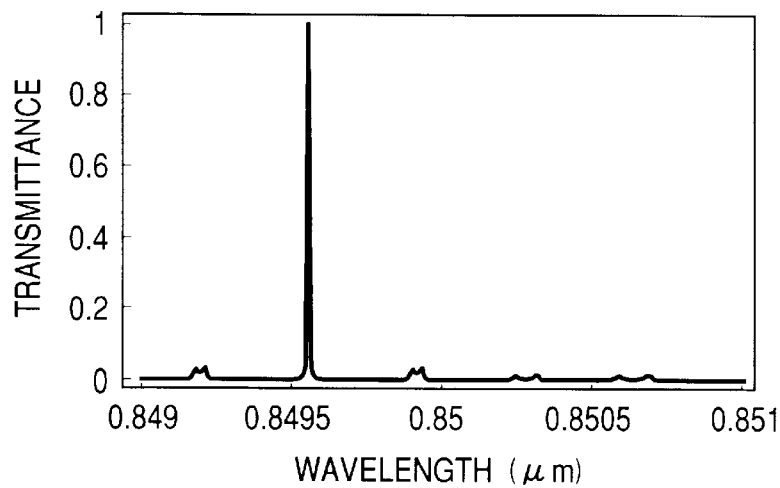

In the case where the inner path (length of one round: $d_3$) and the outer path (length of one round $d_4 > d_3$) are optically coupled at one or more position, the ring resonator becomes a coupled resonator. The resonant mode of the coupled resonator is determined where resonant wavelengths are overlapped in FIGS. 2A and 2B. FIG. 2C shows the result.

As seen in FIG. 2C, the number of resonant modes is remarkably decreased, compared with FIGS. 2A and 2B. Furthermore, a main mode with a large transmittance and a sub-mode with a small transmittance appear. In FIG. 1, the inner path and the outer path are optically coupled at two positions. However, in order for the ring resonator to become a coupled resonator, it is appreciated that the inner path and the outer path only need to be optically coupled at one or more position.

Incidentally, the oscillation mode is determined by a resonant mode present in a gain bandwidth of a gain spectrum.

Figure 3A:
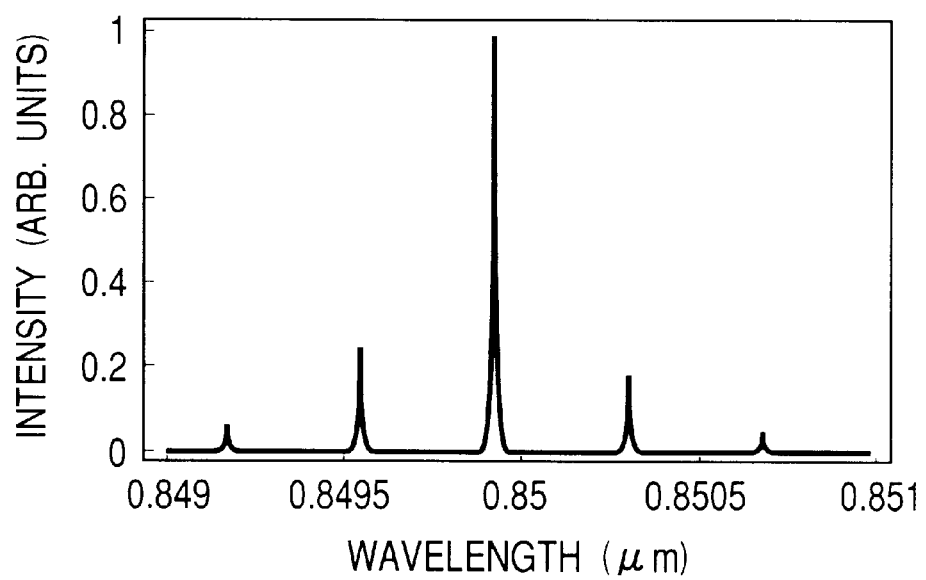
FIGS. 3A and 3B are views illustrating oscillation spectra of the ring laser of the first example according to the present invention.
Figure 3B:
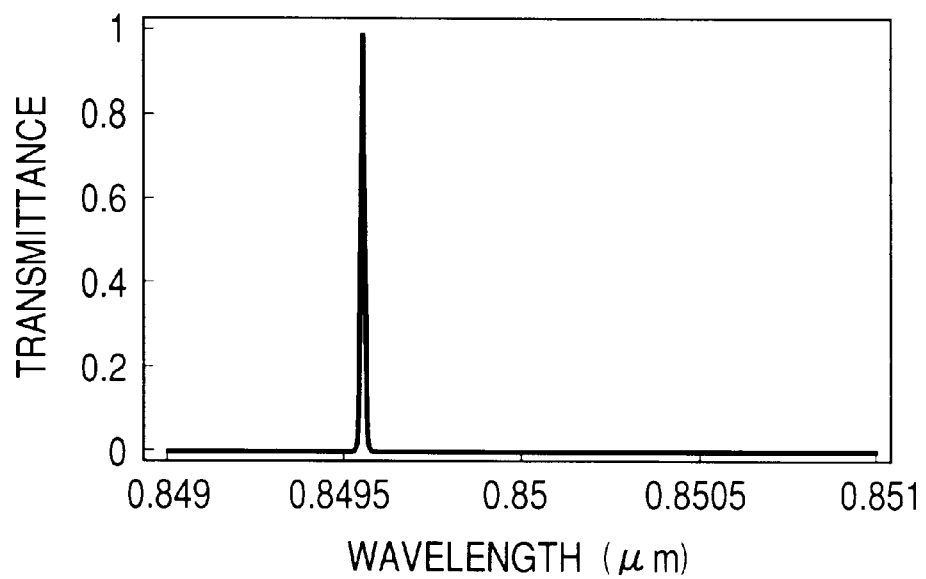

FIG. 3A shows an oscillation spectrum in the case where a ring resonator is constructed by using only an inner path. FIG. 3B shows an oscillation spectrum in a coupled resonator. It is understood that the ring laser having only one single path as shown in FIG. 3A is likely to oscillate in a multi-mode, whereas in the coupled resonator shown in FIG. 3B, sub-modes are sufficiently suppressed, and a longitudinal mode becomes single. In this example, a coupled resonator is obtained by using two paths with different optical path lengths as shown in FIG. 1. However, it is appreciated that three or more paths may be used for obtaining a coupled resonator.

Some care should be taken in forming a coupled resonator. That is, care should be taken so that a propagating direction is not reversed while laser light is propagating through a coupled resonator. If the propagating direction of laser light is reversed, a forward running wave and a backward running wave are coupled at a portion of the path, which causes lock-in.

In a ring laser with the above-mentioned coupled resonator, if counterpropagating laser lights with different oscillation frequencies are present in an optical resonator, a gyro capable of detecting a rotation direction can be realized. Hereinafter, the principle thereof will be described.

It is assumed that a wavelength of first laser light propagating clockwise is $\lambda_1$. Furthermore, it is assumed that a wavelength of second laser light propagating counterclockwise is $\lambda_2$ ($<\lambda_1$). When the ring laser is rotated clockwise, an oscillation frequency $f_1$ of the first laser light in a clockwise direction is decreased by $$\Delta f_1 = 2S_1/\lambda_1 L_1 \qquad (1)$$

compared with an oscillation frequency $f_{10}$ during non-rotation. Herein, $S_1$ represents a closed area surrounded by an optical path of the first laser light, $L_1$ represents an optical path length of the first laser light, and $\Omega$ represents an angular velocity of rotation. On the other hand, an oscillation frequency $f_2$ of the second laser light in the counterclockwise direction is increased by $$\Delta f_2 = 2S_2/\lambda_2 L_2 \qquad (2)$$

compared with an oscillation frequency $f_{20}$ during non-rotation. Herein, $S_2$ represents a closed area surrounded by an optical path of the second laser light, and $L_2$ represents an optical path length of the second laser light. At this time, both the first and second laser beams are present in the ring laser. Thus, beat light is generated in the ring laser, which has a difference in an oscillation frequency between the first laser light and the second laser light:

$$f_2 - f_1 = (f_{20} + \Delta f_2) - (f_{10} - \Delta f_1) = f_{20} - f_{10} + (2S_2\Omega/(\lambda_2 L_2) + 2S_1\Omega/(\lambda_1 L_1)) \qquad (3)$$

On the other hand, when the ring laser is rotated counterclockwise, beat light with the following frequency is generated.

$$f_2 - f_1 = (f_{20} - \Delta f_2) - (f_{10} + \Delta f_1) = f_{20} - f_{10} - (2S_2\Omega/(\lambda_2 L_2) + 2S_1\Omega/(\lambda_1 L_1)) \qquad (4)$$

When two or more oscillation modes are present in the ring laser, population inversion shows time fluctuations in accordance with the difference in the oscillation frequencies between the modes. This phenomenon is known as pulsation in population inversion. In the case of a current injection type laser such as a gas laser and a semiconductor laser, the population inversion and the impedance of a laser have a one-to-one relationship. When light interferes in a laser, population inversion is changed accordingly. As a result, the impedance between electrodes of the laser is changed. This change appears as a change in a terminal current, if a constant voltage source is used as a power source of driving. If a constant current source is used, as a change in a terminal voltage, a state of light interference can be taken as a signal. Needless to say, the change in impedance can be measured directly by an impedance meter. Thus, a change in a current, a voltage, or impedance of the ring laser can be used as a beat signal in accordance with rotation. Needless to say, if counterpropagating light beams in the resonator of the ring laser are allowed to be outputted and inputted to a photodetector simultaneously, a beat signal can be taken out from the photodetector. It is also preferable for reducing noise to conduct statistical processing, such as an average and a difference, by using, as a beat signal, the change in a current, a voltage, or impedance of the ring laser and the signal from the photodetector.

According to the present invention, as represented by Equations (3) and (4), a beat frequency is increased/decreased in accordance with a rotation direction. Thus, by observing an increase/decrease in a beat frequency from the non-rotation time, a rotation direction can be detected. The rotation direction can be detected only when the difference in an oscillation frequency satisfies the following condition.

$$(f_2 - f_1) \geq 0 \qquad (5)$$

If the oscillation wavelength of the first laser light is equal to that of the second laser light, $$(f_2 - f_1) = 0 \qquad (6)$$

is satisfied, and a beat frequency $f_2 - f_1$ takes a positive/negative value. If the absolute values of the beat frequencies are equal to each other, the same signal is detected. In this case, a rotation direction cannot be detected. In contrast, according to the constitution of the present invention in which the sign of the beat frequency is always the same (in the description, the sign is assumed to be positive), and only the absolute value is changed depending upon the rotation direction, the rotation direction can be detected.

In order to change the oscillation frequencies of counter-propagating laser lights in the ring laser, the difference may be provided between the light intensities of the respective laser light. The reason for this will be described. In the case where laser lights of two modes are present, it is known that the oscillation frequency $f_i$ and the photon number density $S_i (i=1,2)$ have the following relationship:

$$2\pi f_1 + d\Phi_1/dt = \Omega_1 + \sigma_1 - \rho_1 S_1 - \tau_{12} S_2 \qquad (7)$$

$$2\pi f_2 + d\Phi_2/dt = \Omega_2 + \sigma_2 - \rho_2 S_2 - \tau_{21} S_1 \qquad (8)$$

where $\Phi_i$ represents a phase, $\Omega_i$ represents a resonant angular frequency, $\sigma_i$ represents a mode pulling coefficient, $\rho_i$ represents a self-mode-pushing coefficient, and $\tau_i$ represents a cross-mode-pushing coefficient. Herein, i, j=1, 2: i≠j. In the case where laser lights in two mode-operations are different in light intensities, (i.e., photon number densities $S_1$ and $S_2$ are different), the difference can be provided in the oscillation frequencies in accordance with Equations (7) and (8).

In order to provide the difference in light intensities with counterpropagating laser lights, a loss may be provided to only the light beam propagating in one rotational direction. For example, by providing a taper portion in an asymmetric shape in a portion of an optical waveguide, a total reflection condition is not satisfied with respect to light incident upon the taper portion. Therefore, a mirror loss is caused in the light incident upon the taper portion. An incident angle upon the taper portion is varied depending upon the propagating direction of light, so that a loss is rendered large with respect to the laser light propagating in a direction, and a loss is rendered small with respect to the counterpropagating light beams. Alternatively, an optical element that gives the difference in light intensity to counterpropagating laser lights may be included in at least part of an optical waveguide.

As described above, the gyro of the present invention generates a beat signal when standing still and rotating. The beat frequency of this signal can be output by being converted into a voltage by allowing a beat signal to be inputted to a frequency-voltage conversion circuit. It is also appreciated that a frequency counter may be used in place of the frequency-voltage conversion circuit. As described above, the beat frequency contains a component proportional to an angular velocity of rotation. Therefore, by obtaining the relationship between the rotation speed and the output of the frequency-voltage conversion circuit or the frequency counter beforehand, the output can be converted into an angular velocity.

An angular velocity of rotation and a rotation direction are detected by using a beat frequency. Therefore, it is important to reduce the fluctuations in a beat frequency. As described above, the beat frequency depends upon the difference in light intensities of counterpropagating laser lights. Therefore, if the light intensities of laser lights fluctuate, the oscillation frequencies also fluctuate. Consequently, the beat frequency that is the difference in oscillation frequencies fluctuate. In order to prevent this, the fluctuations in light intensities of laser lights may be reduced. In a current injection type laser, the light intensities of laser lights are increased substantially in proportion to $(I-I_{th})$. Herein, I represents an injection current and $I_{th}$ represents a threshold current. The shift of the relationship between the light intensity of laser light and $(I-I_{th})$ from a linearity is caused by a nonlinear effect such as gain saturation. Furthermore, in a semiconductor laser, a shift between a gain peak and a resonant peak, an overflow of carriers, inter valence band absorption, the Auger effect, and the like also influence a shift from a linearity. However, even if there is a shift from a linearity, the light intensities of laser lights can be controlled with an injection current, so that the oscillation frequencies can also be controlled with an injection current. When the difference in light intensities of laser lights becomes large, the difference in oscillation frequency, i.e., the beat frequency is also increased. Thus, in order to control this, feedback may be conducted so that an injection current is decreased. On the contrary, when the difference in light intensities of laser lights becomes small, feedback may be conducted so that an injection current is increased.

In order to realize the above-mentioned objects, it is appreciated that a voltage source as well as a current source may be used as a power source of driving.

In order to suppress the fluctuations in oscillation frequencies, a feedback signal for controlling a power source of driving is required. Furthermore, an output current or an output voltage of the power source of driving is modulated in accordance with the feedback signal. If feedback is conducted so that a beat frequency becomes constant when a gyro is subjected to rotation, the feedback signal and the output current or the output voltage of the power source of driving have information on an angular velocity of rotation. Thus, the feedback signal and the output current or the output voltage of the power source of driving can also be used as an output signal of the gyro. In particular, in the case where these signals are larger than the outputs from the terminal of the gyro and the photodetector, a load of an amplifier becomes light. Alternatively, this is preferable in that the amplifier is not required. Furthermore, it is considered that by conducting statistical processing such as an average (including a weighted average) and a difference, using at least two signals among the feedback signal, the output current or the output voltage of the power source of driving, and the outputs from the terminal of the gyro and the photodetector, a signal/noise ratio can be improved.

As described above, by allowing counterpropagating laser lights with different oscillation frequencies to be present in an optical resonator, a ring laser type gyro capable of detecting a rotation direction can be realized. On the other hand, by increasing the difference in loss or net gain difference with respect to the laser lights, the constitution may be used in which only laser light propagating in one direction is present. In this case, with a ring laser alone, a beat signal cannot be obtained. However, a vertical mode is made single. Therefore, compared with a ring laser in which two modes are present, a ring laser can be realized with a smaller oscillation threshold value and a larger slope efficiency. More specifically, a ring laser with excellent characteristics can be obtained.

Finally, the reason for electrically controlling at least part of multiple paths independently from the other paths will be described. A refractive index of a path can be modulated by varying an injection current or an applied voltage. Therefore, an optical path length of a path can be changed by electrical control. The number of resonant modes can be restricted due to the difference in optical path length of multiple paths. Therefore, if at least part of multiple paths can be electrically controlled independently from the other paths, the difference in optical path length can be controlled so that the most stable single longitudinal mode operation can be realized. Consequently, compared with the case where a refractive index of multiple paths is controlled with a single electrode (a refractive index in each path is similarly changed), it becomes easier to control the difference in optical path length to be optimum.

EXAMPLES

Example 1

The features of the present invention are best understood from FIG. 1. FIG. 1 is a top view of an optical waveguide. In FIG. 1, an inner path (length of one round: $d_3$) and an outer path (length of one round: $d_4 > d_3$) are connected to each other at points A and B.

Assuming that an effective refractive index of the path is $n_{eff}$, a resonant wavelength $\lambda_3$ with respect to the inner path and a resonant wavelength $\lambda_4$ with respect to the outer path are represented by $\lambda_3 = n_{eff} d_3 / m_3$ and $\lambda_4 = n_{eff} d_4 / m_4$, respectively. Herein, $m_3$ and $m_4$ are positive integers. FIGS. 2A and 2B show resonant characteristics with respect to $d_3 = 600$ $\mu$m and $d_4 = 660$ $\mu$m when the effective refractive index $n_{eff}$ is 3.2.

In FIGS. 2A and 2B, a horizontal axis represents a wavelength and a vertical axis represents a power transmittance of a ring resonator. It is understood from these figures that multiple resonant peaks with the same transmittance are present, and intervals of a resonant mode are slightly shifted from each other in FIGS. 2A and 2B.

In FIG. 1, since the inner path (length of one round: $d_3$) and the outer path (length of one round $d_4 > d_3$) are optically coupled at the points A and B, the ring resonator becomes a coupled resonator. The resonant mode of the coupled resonator is determined where resonant wavelengths are overlapped in FIGS. 2A and 2B. FIG. 2C shows the result. As seen from FIG. 2C, the number of resonant modes is remarkably decreased, compared with FIGS. 2A and 2B. Furthermore, a main mode with a large transmittance and a sub-mode with a small transmittance appear. In FIG. 1, the inner path and the outer path are optically coupled at two positions. However, in order for the ring resonator to become a coupled resonator, it is appreciated that the inner path and the outer path only need to be optically coupled at one or more position.

Incidentally, the oscillation mode is determined by a resonant mode present in a gain bandwidth of a gain spectrum. FIG. 3A shows an oscillation spectrum in the case where a ring resonator is constructed by using only an inner path. FIG. 3B shows an oscillation spectrum in a coupled resonator. It is understood from these figures that the ring laser having only a single path as shown in FIG. 3A is likely to oscillate in a multi-mode, whereas in the coupled resonator shown in FIG. 3B, a sub-mode is sufficiently suppressed, and a longitudinal mode becomes single. In this example, a coupled resonator is obtained by using two paths with different optical path lengths. However, it is appreciated that three or more paths may be used for obtaining a coupled resonator.

Furthermore, the inner path and the outer path are optically coupled to each other as shown in FIG. 1, whereby the propagating directions of laser lights are not reversed while they are propagating through the coupled resonator. Consequently, a forward running wave and a backward running wave will not be coupled to each other due to the coupling of paths. Thus, a single longitudinal mode can be realized without causing lock-in.

Figure 4A:
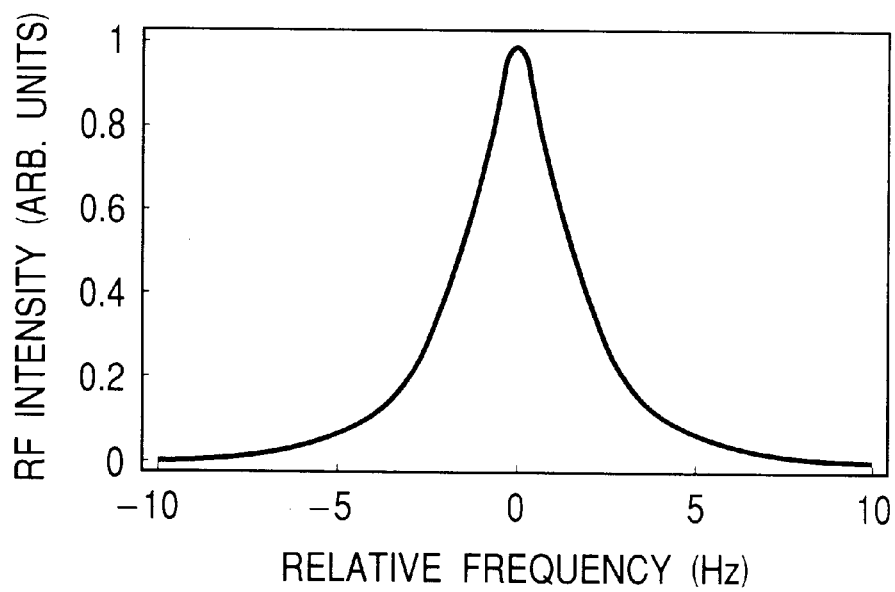
FIGS. 4A and 4B are views illustrating spectra of a beat signal of the ring laser type gyro of the first example according to the present invention.
Figure 4B:
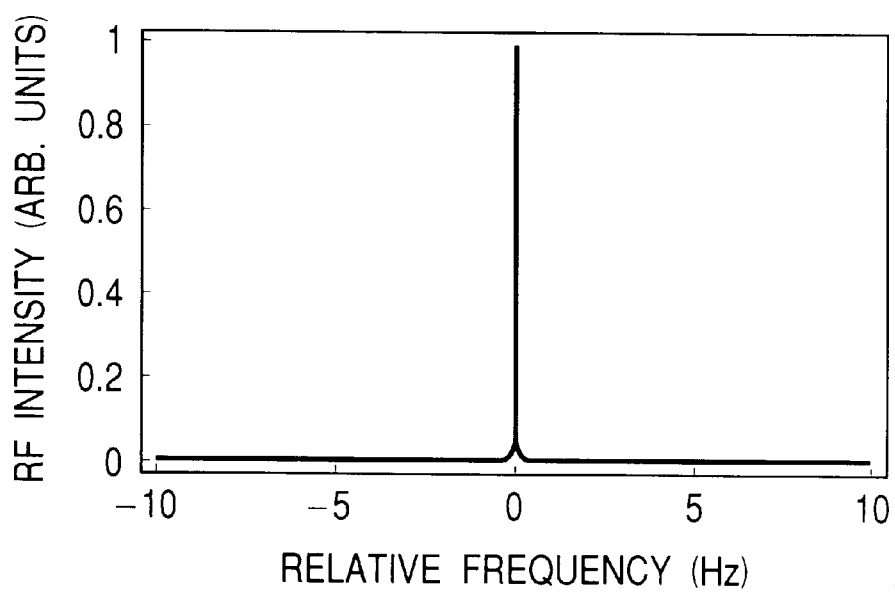

A semiconductor ring laser type gyro is constructed by using the ring resonator in FIG. 1. An active layer is made of InGaAsP. A oscillation threshold current is 3 mA. An oscillation wavelength λ is 1.55 μm when the semiconductor ring laser type gyro stands still at a driving current of 4.5 mA. When the semiconductor ring laser type gyro is subjected to rotation in a clockwise direction at a speed of 30° per second (which is substantially equal to hand-shaking of a camera, a vibration of a car), an oscillation frequency of laser light in a counterclockwise direction is increased by 88.7 Hz. On the other hand, an oscillation frequency of laser light in a clockwise direction is decreased by 88.7 Hz. Thus, a beat frequency Δf becomes 177.4 Hz. FIGS. 4A and 4B show a state where a beat signal at this time is measured by a spectrum analyzer.

FIG. 4A shows the case where there is only one path of laser light. FIG. 4B shows the case where a coupled resonator is constructed as shown in FIG. 1. In both the figures, a horizontal axis represents a displacement from a central frequency, and a vertical axis represents a spectrum intensity. In multiple longitudinal mode operations, a spectrum width is large as shown in FIG. 4A. In contrast, in the case where a ring laser oscillates in a single longitudinal mode, a spectrum width becomes narrow and a signal/noise ratio for detection of a beat signal is improved as shown in FIG. 4B. A spectrum line width in FIG. 4B is one-hundredths of that in FIG. 4A.

Example 2

Figure 5:
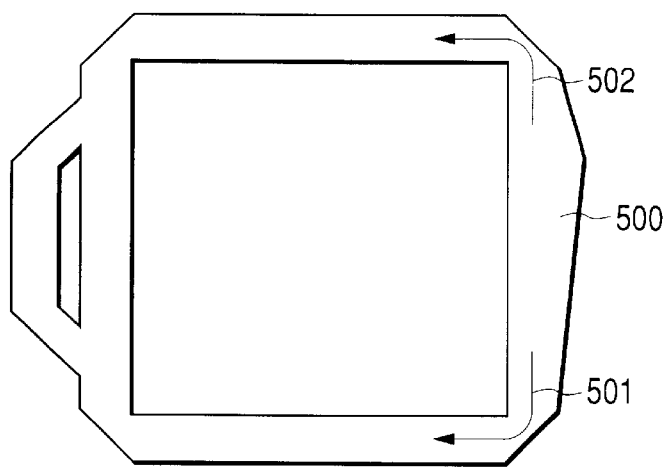
FIG. 5 is a view illustrating a ring laser and a ring laser type gyro of the second example according to the present invention.

The features of Example 2 according to the present invention are best understood from FIG. 5. In FIG. 5, reference numerals 500, 501, and 502 denote an asymmetric taper portion, laser light in a clockwise direction, and laser light in a counterclockwise direction. The difference from Example 1 lies in that an optical waveguide has the asymmetric taper portion 500.

In the above-mentioned constitution, due to the presence of the asymmetric taper portion, a radiation loss with respect to the laser light 502 in the counterclockwise direction becomes larger than that with respect to the laser light 501 in the clockwise direction. As a result, an oscillation threshold value with respect to the laser light 502 in the counterclockwise direction becomes larger than that with respect to the laser light 501 in the clockwise direction.

A semiconductor ring laser type gyro is constructed by using the ring resonator in FIG. 5. An active layer is made of InGaAsP. An oscillation threshold value at room temperature is 3.5 mA with respect to the laser light 502, and 3 mA with respect to the laser light 501. Furthermore, when light outputs at the same current are compared, the intensity of the laser light 501 in the clockwise direction becomes larger than that of the laser light 502 in the counterclockwise direction.

At a driving current of 4.5 mA, when the semiconductor ring laser type gyro stands still, the oscillation wavelength λ of the laser light 501 and that of the laser light 502 are substantially equal (i.e., about 1.55 μm). However, due to the difference in intensities between the laser light 501 and the laser light 502, the oscillation frequency of the laser light 501 is different from that of the laser light 502 by 20 kHz. In the semiconductor ring laser type gyro, the laser light 501 and the laser light 502 interfere with each other. At this time, when a power source current is adjusted to be constant, and a voltage between an anode and a cathode is monitored, a signal with an amplitude of 100 mV and a frequency of 20 kHz is obtained. That is, even when the semiconductor ring laser type gyro stands still, a beat signal can be detected.

When the semiconductor ring laser type gyro is subjected to rotation in the clockwise direction at a speed of 30° per second (hand-shaking of a camera, a vibration of a car, etc.), the oscillation frequency of the laser light 502 in the counterclockwise direction is increased by 88.7 Hz. On the other hand, the oscillation frequency of the laser light 501 in a clockwise direction is decreased by 88.7 Hz. Thus, the beat frequency Δf becomes 20 kHz+177.4 Hz. When the semiconductor ring laser type gyro is subjected to rotation in the counterclockwise direction at a speed of 30° per second, the beat frequency Δf becomes 20 kHz −177.4 Hz. Thus, due to an increase/decrease in the beat frequency from a standstill of the semiconductor ring laser type gyro, a rotation direction as well as a rotation angular velocity can be detected.

FIGS. 4A and 4B show a state in which a beat signal is measured by a spectrum analyzer. FIG. 4A shows the case where there is only one path of laser light. FIG. 4B shows the case where a coupled resonator is constructed as shown in FIG. 5. In both the figures, a horizontal axis represents a displacement from a central frequency, and a vertical axis represents a spectrum intensity. In multiple longitudinal mode operations, a spectrum width is large as shown in FIG. 4A. In contrast, in the case where a ring laser oscillates in a single longitudinal mode, a spectrum width becomes narrow and a signal/noise ratio for detection of a beat signal is enhanced as shown in FIG. 4B. A spectrum line width in FIG. 4B is one-hundredths of that in FIG. 4A.

Example 3

Figure 6:
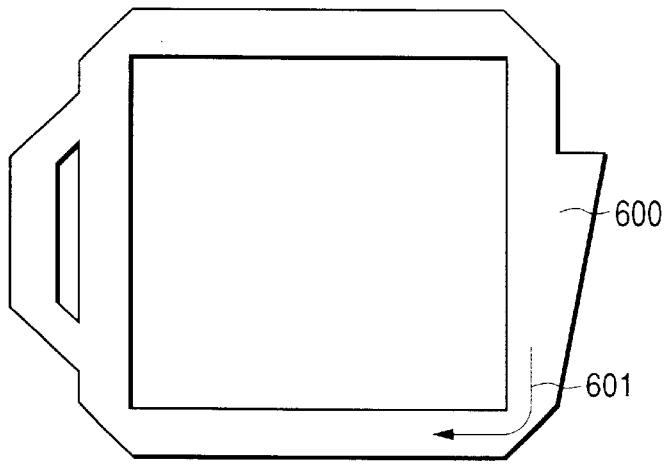
FIG. 6 is a view illustrating a ring laser and a ring laser type gyro of the third example according to the present invention.

The features of Example 3 according to the present invention are best understood from FIG. 6. In FIG. 6, reference numerals 600 and 601 denote a taper portion and laser light in a clockwise direction. The difference from Example 2 lies in the shape of the taper portion 600 of an optical waveguide.

In the above-mentioned constitution, due to the presence of the taper portion, a radiation loss with respect to laser light in a counterclockwise direction becomes large. As a result, the laser light in a counterclockwise direction cannot oscillate. In contrast, a radiation loss with respect to the laser light 601 in a clockwise direction is small, so that only the laser light 601 in a clockwise direction oscillates.

A semiconductor ring laser is constructed by using the ring resonator in FIG. 6. An active layer is made of InGaAsP. An oscillation threshold value at room temperature is 1.8 mA which is smaller than the oscillation threshold value 3 mA when the laser light in the clockwise direction and the laser light in the counterclockwise direction are simultaneously present. This is because carriers injected into the active layer are concentrated only in one oscillation mode. Furthermore, a slope efficiency also becomes about twice that of Example 1. In this manner, according to the constitution in FIG. 6, characteristics of a ring laser are improved.

Example 4

Figure 7:
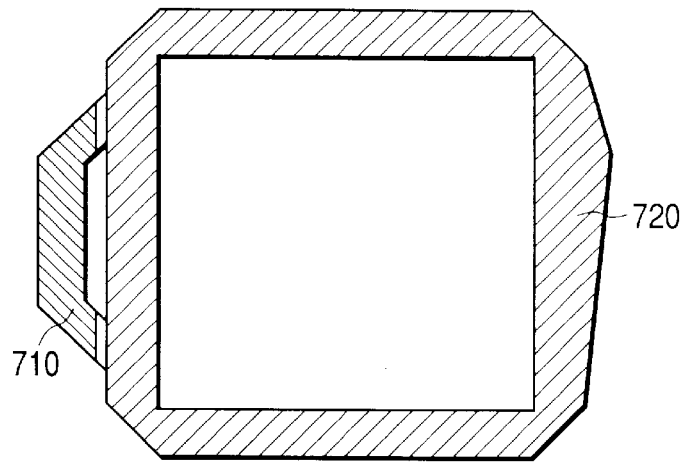
FIG. 7 is a view illustrating a ring laser and a ring laser type gyro of the fourth example according to the present invention.

The features of Example 4 according to the present invention are best understood from FIG. 7. In FIG. 7, reference numerals 710 and 702 denote electrodes that are electrically independent from each other. The difference from Example 2 lies in that an electrode is divided by a path of laser light.

In the above-mentioned constitution, when a current is injected into the electrodes 710 and 720, or a voltage is applied thereto, refractive indexes of an optical waveguide in regions where the electrodes 710 and 720 are formed are varied. Therefore, optical path lengths of two paths of a coupled resonator are independently controlled. This allows a resonant mode interval determined by an inner path and a resonant mode interval determined by an outer path to be controlled independently, and a single longitudinal mode can be achieved most stably. Therefore, even if an optical path length is shifted from a designed value in the course of production of a device, this shift can be corrected. Furthermore, even a shift of a resonant mode with respect to fluctuations in temperature can be compensated.

Example 5

Figure 8:
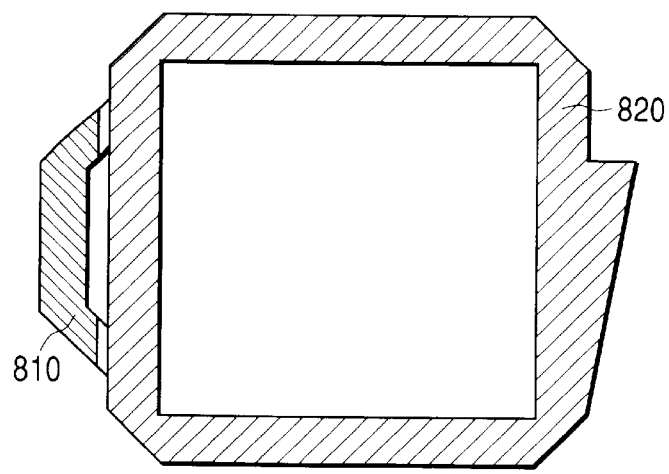
FIG. 8 is a view illustrating a ring laser and a ring laser type gyro of the fifth example according to the present invention.

The features of Example 5 are best understood from FIG. 8. In FIG. 8, reference numerals 810 and 820 denote electrodes electrically independent from each other. The difference from Example 3 lies in that an electrode is divided by a path of laser light.

In the above-mentioned constitution, when a current is injected into the electrodes 810 and 820, or a voltage is applied thereto, refractive indexes of an optical waveguide in regions where the electrodes 810 and 820 are formed are varied. Therefore, optical path lengths of two paths of a coupled resonator are independently controlled. This allows a resonant mode interval determined by an inner path and a resonant mode interval determined by an outer path to be controlled independently, and a single longitudinal mode can be achieved most stably. Therefore, even if an optical path length is shifted from a designed value in the course of production of a device, this shift can be corrected. Furthermore, even a shift of a resonant mode with respect to fluctuations in temperature can be compensated.

Example 6

Figure 9:
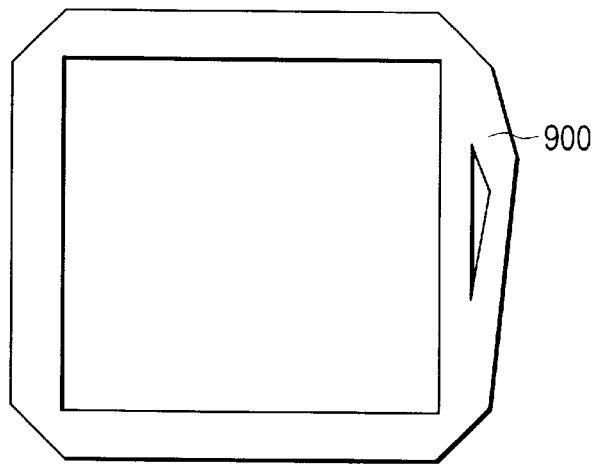
FIG. 9 is a view illustrating a ring laser and a ring laser type gyro of the sixth example according to the present invention.

The features of Example 6 are best understood from FIG. 9. In FIG. 9, reference numeral 900 denotes an asymmetric taper portion. The difference from Example 2 lies in that there is a region in which two paths are optically coupled in the asymmetric taper portion. Thus, the region where two paths are optically coupled may be at any position in the ring resonator. It is also appreciated that in the constitution of FIG. 9, an electrode may be divided.

Example 7

Figure 10:
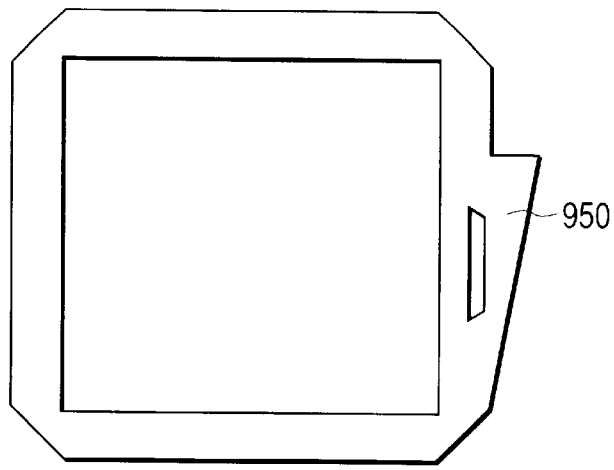
FIG. 10 is a view illustrating a ring laser and a ring laser type gyro of the seventh example according to the present invention.

The features of Example 7 are best understood from FIG. 10. In FIG. 10, a reference numeral 950 denotes a taper portion. The difference from Example 3 lies in that there is a region in which two paths are optically coupled in the taper portion. Thus, the region where two paths are optically coupled may be at any position in the ring resonator. It is also appreciated that in the constitution of FIG. 10, an electrode may be divided.

In Examples 1 to 7, substantially square ring resonators have been described. However, any shape can be used as long as a ring resonator is formed. Exemplary semiconductor ring lasers using an active layer made of InGaAsP have been described. However, there is no particular limit to a material system.

Example 8

Figure 11:
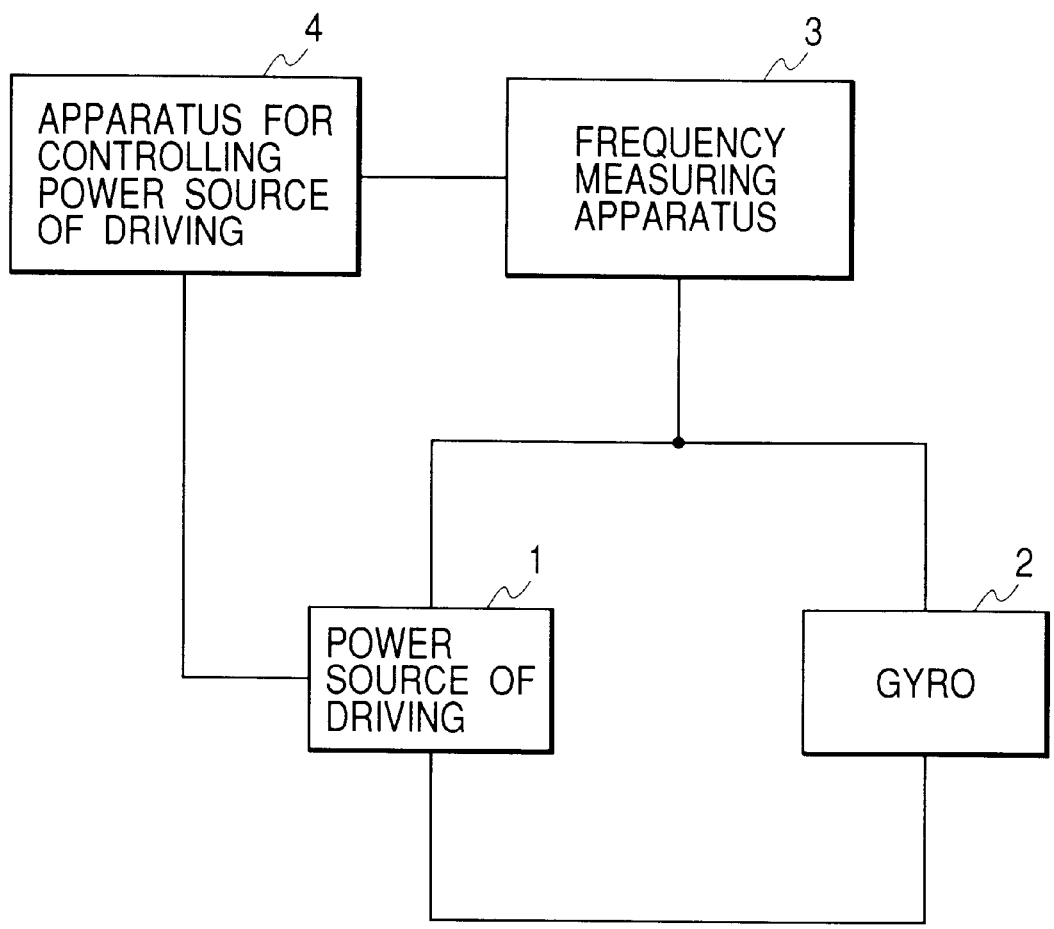
FIG. 11 is a view illustrating a gyro of the eighth example according to the present invention.

The features of Example 8 are best understood from FIG. 11. In FIG. 11, reference numerals 1, 2, 3, and 4 denote a power source of driving, a gyro, a frequency measuring apparatus, and an apparatus for controlling a power source of driving, respectively.

In the above-mentioned constitution, a ring laser type gyro is used as the gyro 2. If a constant voltage source is used as the power source of driving 1, a beat signal appears as a change in a terminal current. Furthermore, if a constant current source is used, a beat signal can be taken out as a change in a terminal voltage. Needless to say, even if a change in impedance is directly measured by an impedance meter, a beat signal is obtained. The frequency of the beat signal is detected by using the frequency measuring apparatus 3. A signal in accordance with the obtained beat frequency is input to the apparatus for controlling a power source of driving 4. Finally, a signal is sent from the apparatus for controlling a power source of driving 4 to the power source of driving 1, whereby a beat frequency is stabilized.

First, an example using, as the gyro 2, a semiconductor ring laser type gyro will be described.

Figure 12A:
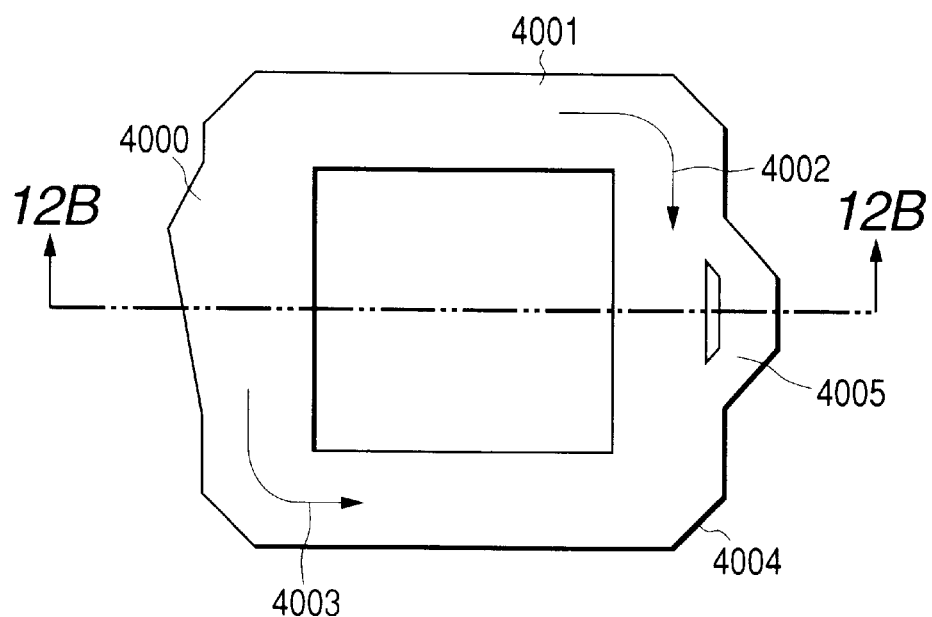
FIGS. 12A and 12B are views illustrating a ring laser type gyro of the eighth example according to the present invention.
Figure 12B:
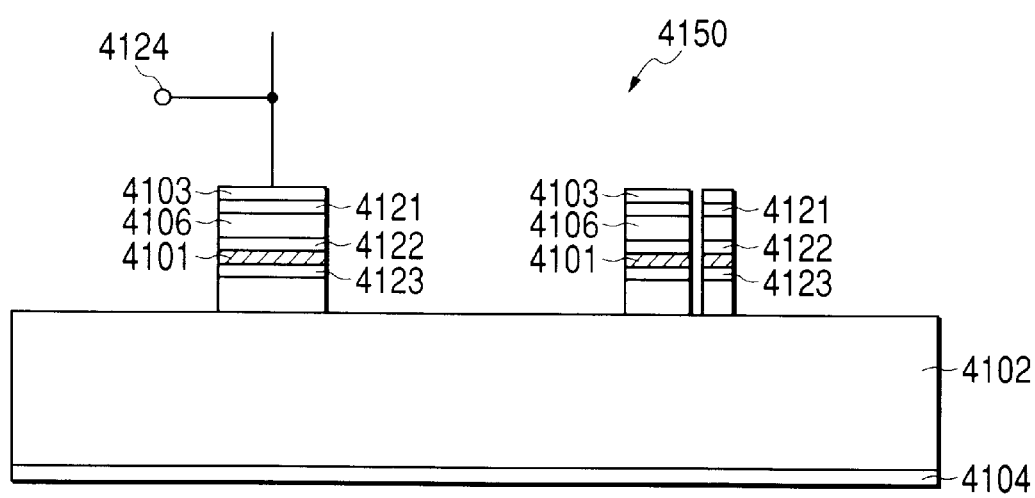

FIGS. 12A and 12B schematically show a semiconductor ring laser type gyro. In FIGS. 12A and 12B, reference numeral 4000 denotes an asymmetric taper portion of an optical waveguide, 4001 and 4005 denote an optical waveguide of the semiconductor ring laser type gyro, 4002 denotes laser light in a clockwise direction, 4003 denotes laser light in a counterclockwise direction, 4004 denotes an end facet, 4101 denotes an active layer, 4102 denotes a semiconductor substrate, 4103 denotes an anode, 4104 denotes a cathode, 4106 denotes a cladding layer, 4121 denotes a cap layer, 4122 and 4123 denote optical guiding layers, 4124 denotes an electric terminal, and 4150 denotes a semiconductor ring laser type gyro. FIG. 12A is a top view, and FIG. 12B is a cross-sectional view taken along a line 12B—12B in FIG. 12A.

A production method of the above-mentioned constitution will be described. First, an undoped InGaAsP optical guiding layer 4123 (thickness: 0.15 $\mu$m) with a band gap wavelength of 1.3 $\mu$m, an undoped InGaAsP active layer 4101 (thickness: 0.1 $\mu$m) with a band gap wavelength of 1.55 $\mu$m, an undoped InGaAsP optical guiding layer 4122 (thickness: 0.15 $\mu$m) with a band gap wavelength of 1.3 $\mu$m, a p-InP cladding layer 4106 (thickness: 2 $\mu$m), and a p-InGaAsP cap layer 4121 (thickness: 0.3 $\mu$m) with a band gap wavelength of 1.4 $\mu$m, which constitute the semiconductor ring laser type gyro 4150, are grown on an n-InP substrate 4102 (thickness: 350 $\mu$m) by metal-organic chemical vapor deposition. After crystal growth, the p-InGaAsP cap layer 4121 is coated with a photoresist AZ-1350 (produced by Hoechst Japan Ltd.) having a thickness of 1 $\mu$m by using a spin coater. The resultant layered structure is prebaked at 80° for 30 minutes. Thereafter, the wafer is exposed to light under the condition of being masked. After development and rinsing, a width of an optical waveguide is 5 $\mu$m, and in the taper portion 4000, the maximum width of the optical waveguide is 8 $\mu$m and the minimum width thereof is 5 $\mu$m. Furthermore, a length of one round of the optical waveguide is 600 $\mu$m. Then, the wafer is placed in a reactive ion etching apparatus, and etched with chlorine gas so that a depth becomes 3 $\mu$m. Finally, Cr/Au is evaporated on the p-InGaAsP cap layer 4121 as the anode 4103. Furthermore, AuGe/Ni/Au is evaporated on the n-InP substrate 4102 as the cathode 4104. Thereafter, the wafer is annealed in a hydrogen atmosphere, whereby Ohmic contact is achieved.

In the above-mentioned constitution, the refractive index of a semiconductor is different from that of air, so that reflection occurs at an interface therebetween. Assuming that the refractive index of a semiconductor is 3.5, total reflection occurs when an angle formed by a normal line to the interface and laser light is 16.6° or more. A mode subjected to total reflection has an oscillation threshold value decreased by a mirror loss, compared with the other modes. Therefore, oscillation starts at a low injection current level. Furthermore, since a coupled resonator is constructed, laser light in a clockwise direction, laser light in a counterclockwise direction, and stable oscillation in a single longitudinal mode can be realized.

Figure 13:
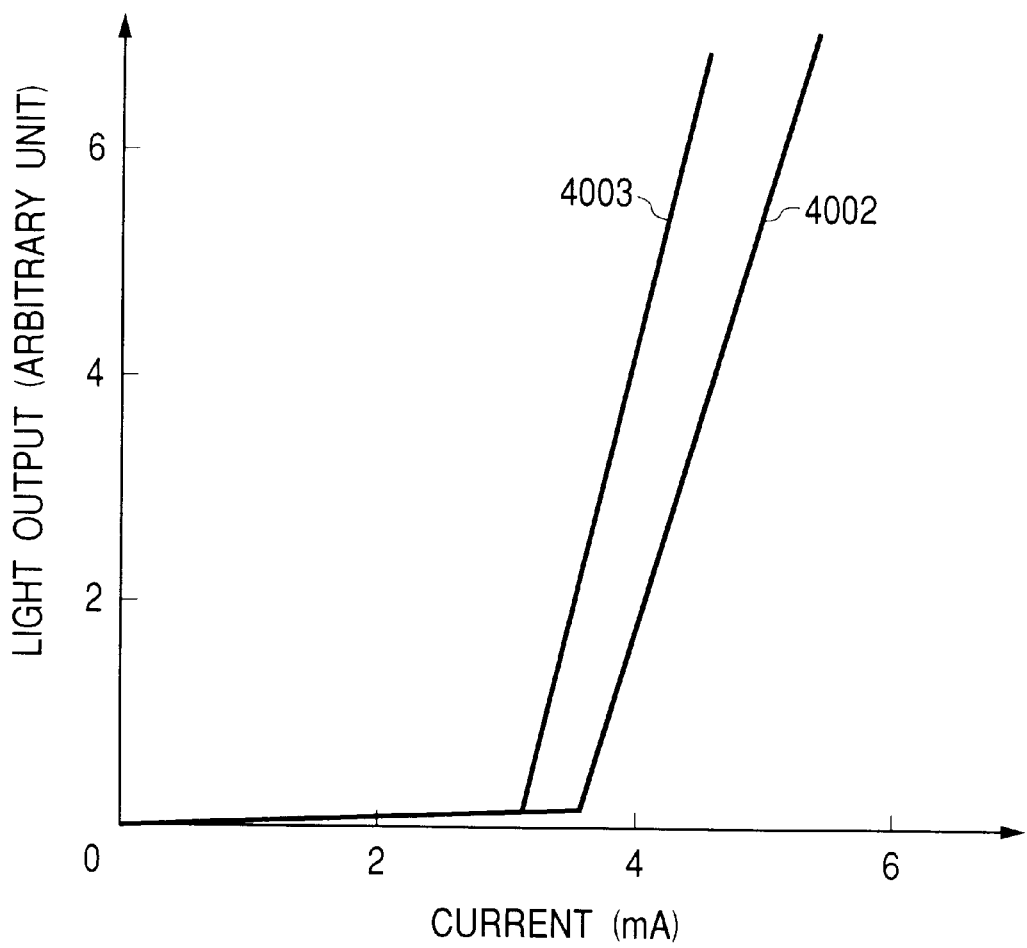
FIG. 13 is a graph illustrating current—light output characteristics of the ring laser type gyro of the eighth example according to the present invention.

In FIGS. 12A and 12B, the angle formed by the normal line to the interface and the laser light is 45°, which satisfies a total reflection condition. The oscillation threshold current at room temperature is 3.5 mA with respect to the laser light 4002 and 3 mA with respect to the laser light 4003. FIG. 13 is a graph showing current—light output characteristics of a ring resonator laser at room temperature, and illustrating the above-mentioned state.

The light intensity in FIG. 13 is measured by coupling an optical component to a mirror portion so as to take laser light out of a ring resonator.

The driving current of the semiconductor ring laser type gyro 4150 is 4.5 mA. When the gyro stands still, the oscillation wavelength λ of the laser light 4002 and that of the laser light 4003 are substantially equal to each other (about 1.55 μm). However, the oscillation threshold current with respect to the laser light 4003 is smaller than that with respect to the laser light 4002.

Thus, as shown in FIG. 13, the light intensity of the laser light 4003 is larger than that of the laser light 4002. Therefore, the oscillation frequencies thereof are slightly different. Specifically, an oscillation frequency $f_3$ of the laser light 4003 is larger than an oscillation frequency $f_4$ of the laser light 4002 by 20 kHz. The laser light 4002 and the laser light 4003 interfere with each other in the semiconductor ring laser type gyro 4150. At this time, when a power source current is adjusted to be constant, and a voltage between the electrode terminal 4124 and the cathode 4104 is monitored, a signal with an amplitude of 100 mV and a frequency of 20 kHz is obtained.

Figure 14A:
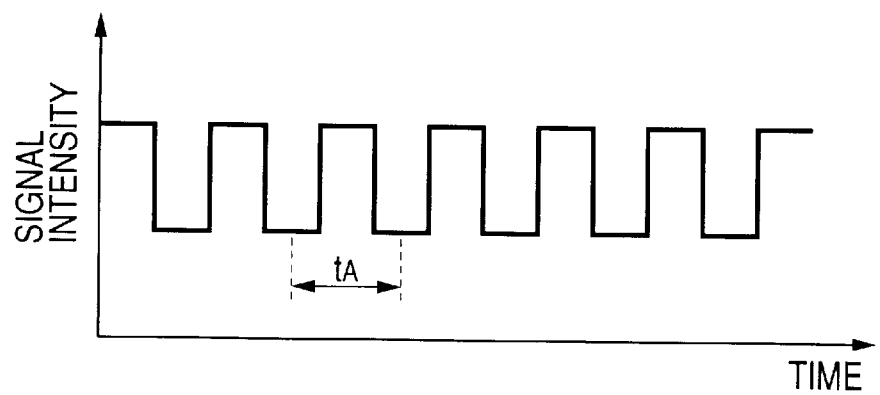
FIGS. 14A, 14B, and 14C are views illustrating a beat signal of the gyro of the eighth example according to the present invention.
Figure 14B:
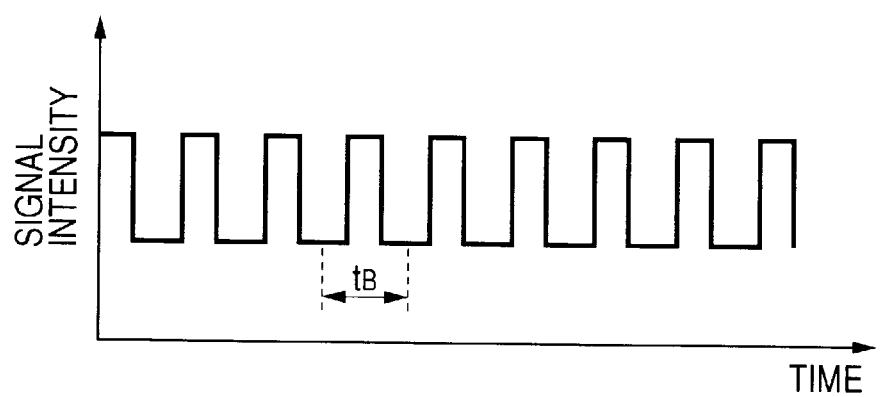
Figure 14C:
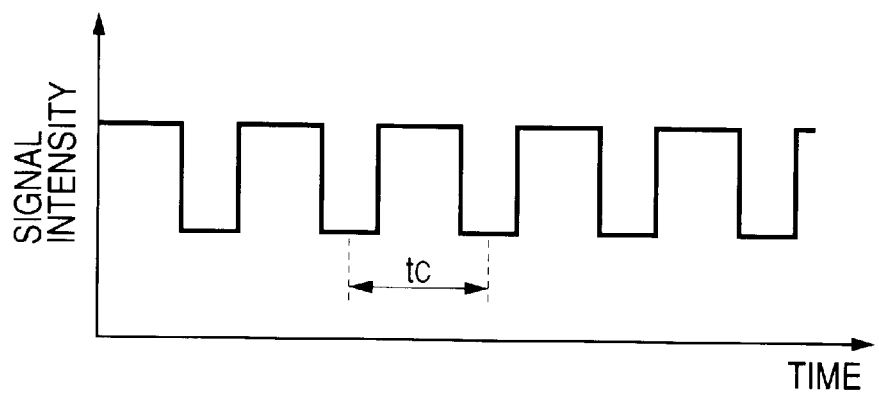

FIGS. 14A to 14C show the above-mentioned state. More specifically, even when the semiconductor ring laser type gyro 4150 stands still, a beat signal can be detected. When the semiconductor ring laser type gyro 4150 is subjected to rotation in a clockwise direction at a speed of 30° per second (which is substantially equal to hand-shaking of a camera, a vibration of a car), an oscillation frequency $f_3$ of the laser light 4103 in the counterclockwise direction is increased by 88.7 Hz. On the other hand, an oscillation frequency $f_4$ of the laser light 4102 in the clockwise direction is decreased by 88.7 Hz. Thus, the beat frequency $f_3-f_4$ becomes 20 kHz+ 177.4 Hz. FIG. 14B shows this state.

On the other hand, when the semiconductor ring laser type gyro 4150 is subjected to rotation in the counterclockwise direction at a speed of 30° per second, the beat frequency $f_3-f_4$ becomes 20 kHz−177.4 Hz. FIG. 14C shows this state.

The absolute value of an increase/decrease amount in the beat frequency is proportional to a rotation speed, so that the rotation speed can be detected. In addition to this, the rotation direction and an increase/decrease in the beat frequency have one-to-one correspondence, so that the rotation direction can be detected.

In the present example, a change in a terminal voltage is measured under the condition of constant current driving. In the case of constant voltage driving, a change in current flowing through the terminal can be detected. Furthermore, a change in impedance may be directly detected by using an impedance meter.

Figure 15A:
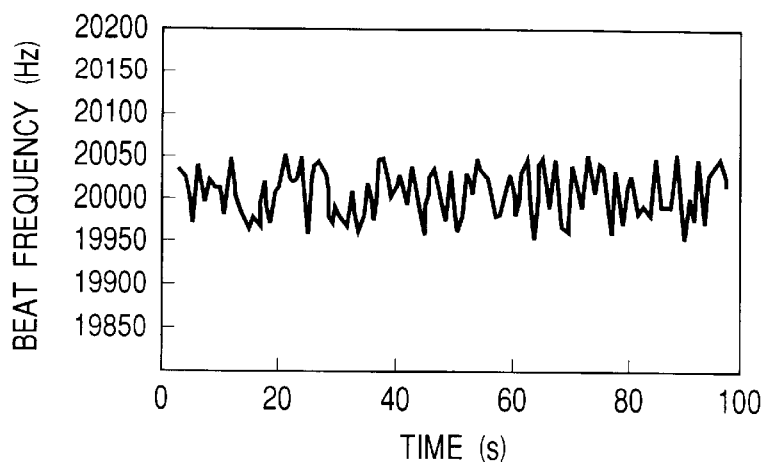
FIGS. 15A, 15B, and 15C are views illustrating fluctuations in a beat signal of the gyro of the eighth example according to the present invention.

Hitherto, the case has been described in which the beat frequency during a standstill is 20 kHz. When the apparatus for controlling a power source of driving 4 is turned off, the beat signal during a standstill fluctuates by about ±50 Hz, as shown in FIG. 15A.

In contrast, when the power source of driving 1 is controlled by the apparatus for controlling a power source of driving 4 after a beat frequency is measured as in the present invention, a beat frequency can be stabilized as shown in FIG. 5B.

Figure 15B:
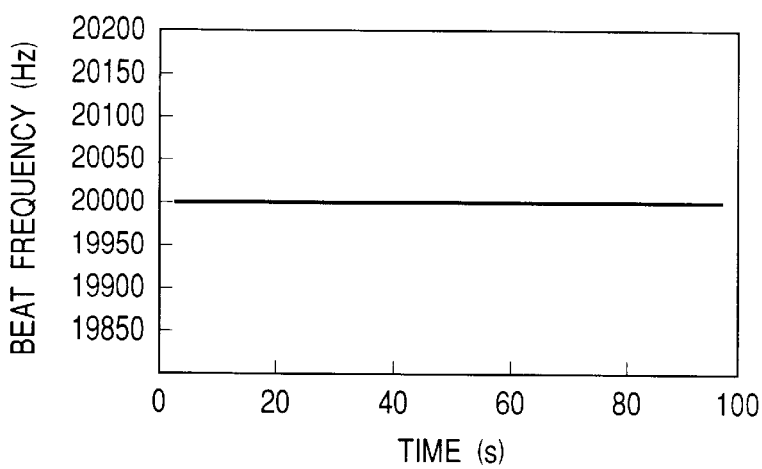
Figure 15C:
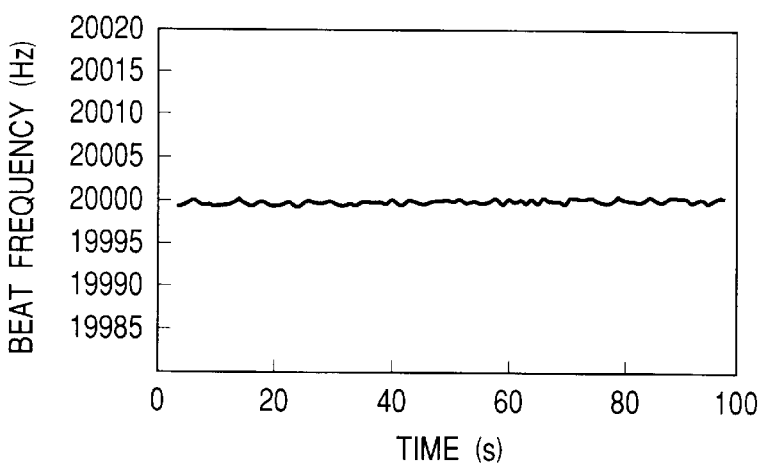

FIG. 15C shows the diagram in FIG. 15B by enlarging the vertical axis. In FIG. 15C, a frequency fluctuation is suppressed to ±1 Hz or less. This result is obtained by controlling under the condition that the electrodes of the optical waveguides 4001 and 4005 are connected to each other. When the electrodes of the optical waveguides 4001 and 4005 are independently controlled, a frequency fluctuation is reduced to ±0.1 Hz, as shown in FIG. 4B.

Herein, a terminal voltage is used as a beat signal. However, an output signal of the apparatus for controlling a power source of driving 4 containing information on a beat signal, an output current or an output voltage of the power source of driving may be used as a signal for detecting an angular velocity. Furthermore, it is also preferable in terms of enhancement of a signal/noise ratio that at least two of the above-mentioned signal, current and voltage are used as signals, and statistical processing (an average (including a weighted average) and a difference) is conducted.

In the present example, as a semiconductor material, an InGaAsP system has been used. However, any material system such as a GaAs system, a ZnSe system, an InGaN system, and an AlGaN system may be used. Regarding the shape surrounded by an optical path in the optical waveguide, any shape such as a hexagon, a triangle, and a circle, as well as a square as shown in FIGS. 12A and 12B may be used.

Example 9

Figure 16:
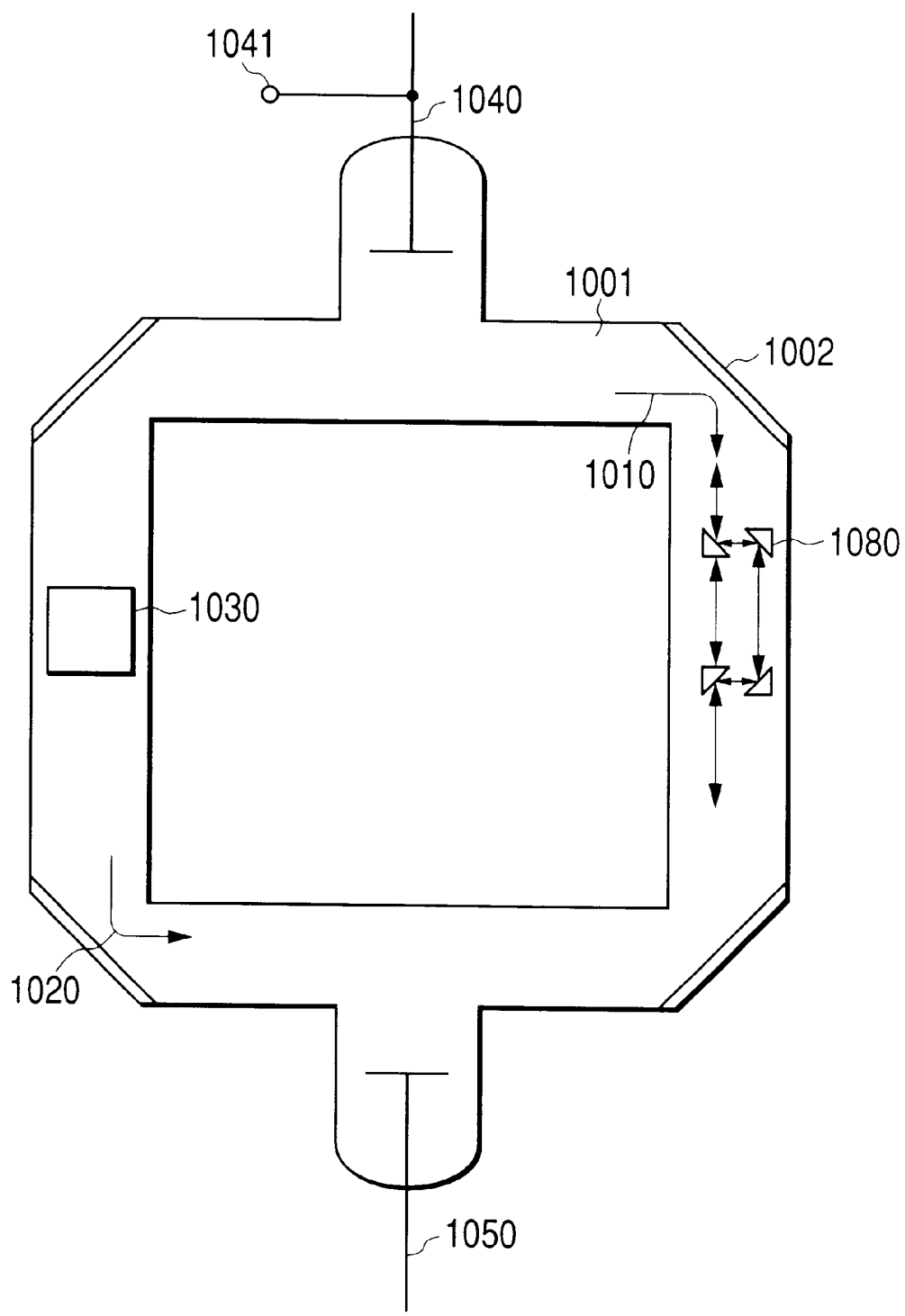
FIG. 16 is a view illustrating a gyro of the ninth example according to the present invention.

The features of Example 9 are best understood from FIG. 16. FIG. 16 schematically shows a gas ring laser type gyro. In FIG. 16, reference numeral 1001 denotes a silica tube, 1002 denotes a mirror, 1010 denotes laser light in a clockwise direction, 1020 denotes laser light in the counterclockwise direction, 1030 denotes an optical isolator, 1040 denotes an anode, 1041 denotes an electric terminal, 1050 denotes a cathode, and 1080 denotes a mirror.

First, a silica block is drilled with a drill to form the silica tube 1001. Thereafter, the mirror 1002 is attached to the silica tube 1001. Furthermore, the silica tube 1001 is provided with the anode 1040, the electric terminal 1041, and the cathode 1050. Then, helium gas and neon gas are introduced into the silica tube 1001, and a voltage is applied between the anode and the cathode, whereby discharge starts and a current starts flowing. In the silica tube 1001, the laser light 1010 in the clockwise direction and the laser light 1020 in the counterclockwise direction oscillate. Since two paths are formed with respect to laser light by using the mirror 1080, thereby constituting a coupled resonator, stable oscillation in a single longitudinal mode can be realized with respect to the laser light in the clockwise direction and the laser light in the counterclockwise direction.

When the gas ring laser type gyro stands still, the oscillation frequency of the laser light 1010 and that of the laser light 1020 are substantially equal to each other ($4.37 \times 10^{14}$ Hz), and an oscillation wavelength λ is 632.8 nm. Since the optical isolator 1030 is inserted into an optical path of laser light, the oscillation threshold current with respect to the laser light 1010 is smaller than that with respect to the laser light 1020. Therefore, the light intensity of the laser light 1010 is larger than that of the laser light 1020. Specifically, an oscillation frequency $f_1$ of the laser light 1010 is larger than an oscillation frequency $f_2$ of the laser light 1020 by 20 MHz. In the silica tube 1001, the laser light 1010 and the laser light 1020 interfere with each other. At this time, when a power source current is adjusted to be constant, and a voltage between the electrode terminal 1041 and the cathode 1050 is monitored, a signal with an amplitude of 100 mV and a frequency of 20 MHz is obtained. More specifically, even when the gas ring laser type gyro stands still, a beat signal can be detected.

When the gas ring laser type gyro is subjected to rotation in the clockwise direction at a speed of 180° per second, and the length of one side of the resonator is 10 cm, the oscillation frequency $f_1$ of the laser light 1010 in the counterclockwise direction is increased by 248.3 kHz. On the other hand, the oscillation frequency $f_2$ of the laser light 1020 in the clockwise direction is decreased by 248.3 kHz. Thus, the beat frequency $f_1-f_2$ becomes 20 MHz+496.6 Hz. When the gas ring laser type gyro is subjected to rotation in the counterclockwise direction at a speed of 180° per second, the beat frequency $f_1-f_2$ becomes 20 MHz−496.6 Hz. The absolute value of an increase/decrease amount in the beat frequency is proportional to a rotation speed, so that the rotation speed can be detected. In addition to this, the rotation direction and an increase/decrease in the beat frequency have one-to-one correspondence, so that the rotation direction can be detected.

In the present example, a change in a terminal voltage is measured under the condition of constant current driving. In the case of constant voltage driving, a change in current flowing through the terminal can be detected. Furthermore, a change in impedance of discharge may be directly detected by using an impedance meter.

In the present example, when the apparatus for controlling a power source of driving 4 is turned off, the beat signal during a standstill fluctuates by about ±100 Hz. In contrast, when the power source of driving 1 is controlled by the apparatus for controlling a power source of driving 4 after measuring the beat frequency as in the present invention, a frequency fluctuation is suppressed to ±1 Hz or less.

Herein, a terminal voltage is used as a beat signal. However, an output signal of the apparatus for controlling a power source of driving 4 containing information on a beat signal, an output current or an output voltage of the power source of driving may be used as a signal for detecting an angular velocity. Furthermore, it is also preferable in terms of enhancement of a signal/noise ratio that at least two of the above-mentioned signal, current and voltage are used as signals, and statistical processing (an average (including a weighted average) and a difference) is conducted.

Herein, although helium gas and neon gas are used, any gas may be used as long as it allows a laser to oscillate. Regarding the shape surrounded by an optical path in the optical waveguide, any shape such as a hexagon, a triangle, and a circle, as well as a square as shown in FIG. 16 may be used.

Next, the frequency measuring apparatus 3 will be described. By allowing a beat signal to pass through a frequency-voltage conversion circuit (FV conversion circuit), a beat frequency can be converted to a voltage. For example, assuming that an offset is adjusted, and a voltage output of the frequency-voltage conversion circuit (FV conversion circuit) at a time of a standstill of the gyro 2 is zero, a rotation direction can be detected depending upon the plus/minus of the output of the frequency-voltage conversion circuit (FV conversion circuit).

Figure 17:
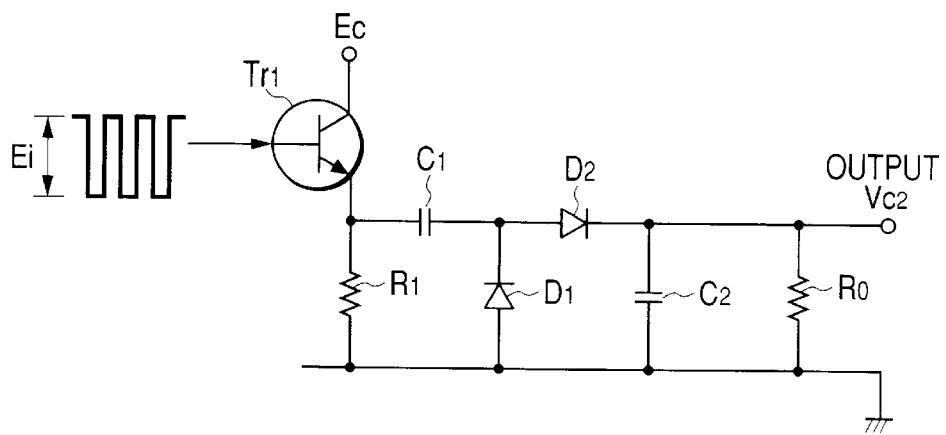
FIG. 17 is a view illustrating an FV conversion circuit of the ninth example according to the present invention.

FIG. 17 shows an exemplary frequency-voltage conversion circuit (FV conversion circuit). This circuit is composed of a transistor, a diode, a capacitor, and a resistor, and an output voltage $V_{C2}$ can be represented by the following equation.

$$V_{C2}=(E_I C_1 R_0 f)/(1+[1/\{1-exp(-1/R_0 C_2 f)\}])$$

where, $E_I$ represents a peak-to-peak value of an input voltage, and f represents a beat frequency. A circuit parameter is designed so as to satisfy $C_2 \gg C_1$ and $R_0 C_2 f < 1$, whereby $$V_{C2} \approx (E_I C_1 R_0 f)/2$$

is satisfied, and a voltage output in proportion to the beat frequency can be obtained.

Furthermore, a frequency counter is commercially available as an IC. It is preferable for miniaturization of an apparatus to use the frequency counter as the frequency measuring apparatus 3.

Example 10

Figure 18:
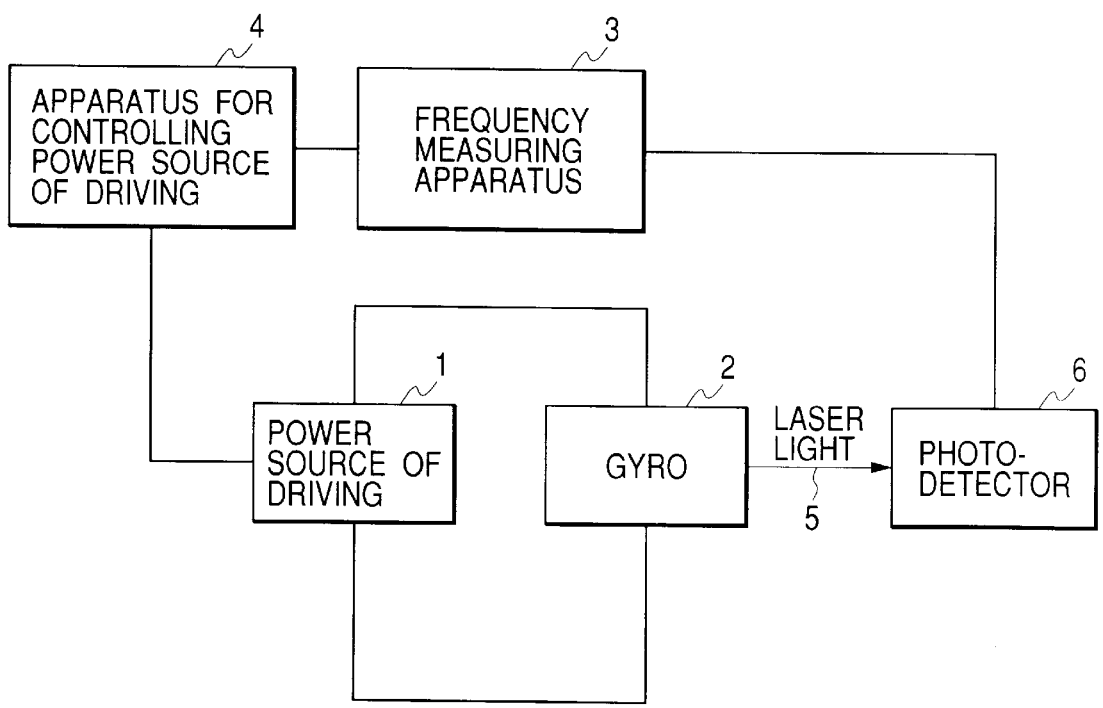
FIG. 18 is a view illustrating a gyro of the tenth example according to the present invention.

The features of Example 10 are best understood from FIG. 18. In FIG. 18, reference numeral 5 denotes laser light emitted from the gyro, and 6 denotes a photodetector.

In the above-mentioned constitution, a ring laser type gyro is used as the gyro 2. The laser light 5 emitted from the gyro 2 enters the photodetector 6. At this time, if the laser light 5 is composed of laser light in the clockwise direction and laser light in the counterclockwise direction, beat light is generated in the photodetector 6, and a signal having the beat frequency thereof is output from the photodetector 6. The beat frequency is detected by using the frequency measuring apparatus 3. A signal in accordance with the obtained beat frequency is input to the apparatus for controlling a power source of driving 4. Finally, a signal is sent from the apparatus for controlling a power source of driving 4 to the power source of driving, thereby stabilizing the beat frequency.

First, an example using, as the gyro 2, a semiconductor ring laser type gyro will be described.

Figure 19A:
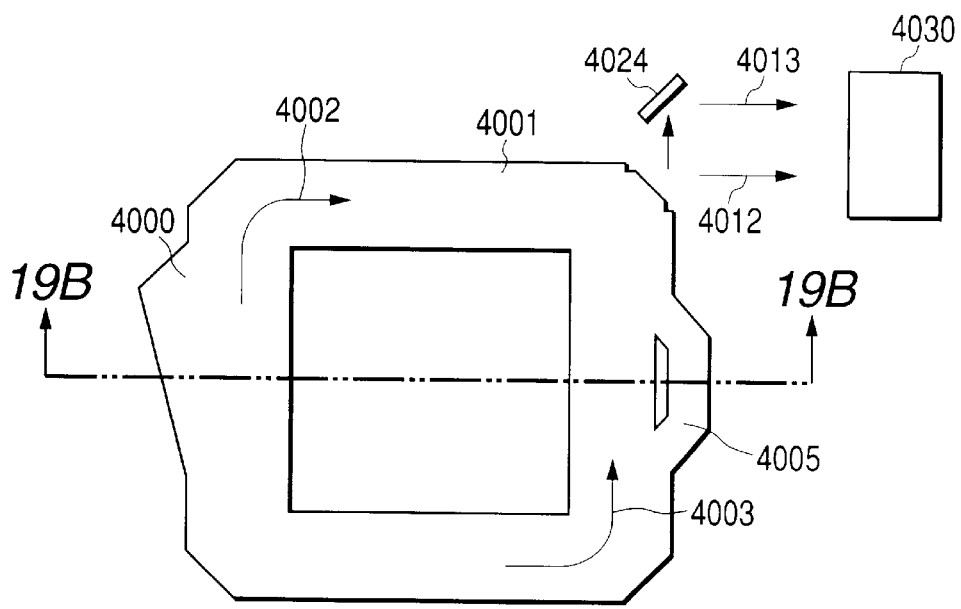
FIGS. 19A and 19B are views illustrating a gyro of the tenth example according to the present invention.
Figure 19B:
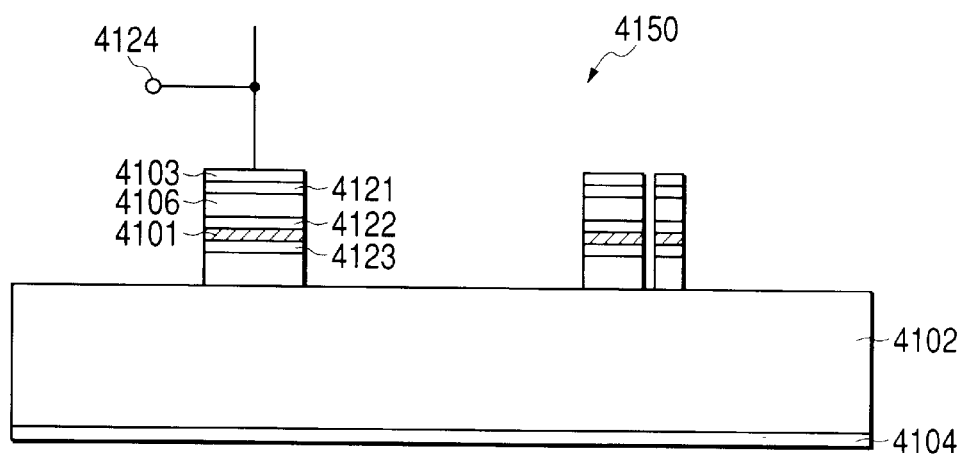

FIGS. 19A and 19B schematically show a semiconductor ring laser type gyro. The difference from FIGS. 12A and 12B lies in that a laser light emitting portion is provided. In FIGS. 19A and 19B, reference numeral 4012 denotes emitted laser light in the clockwise direction, 4013 denotes emitted laser light in the counterclockwise direction, 4024 denotes a mirror, and 4030 denotes a photodetector. FIG. 19A is a top view, and FIG. 19B is a cross-sectional view taken along a line 19B—19B in FIG. 19A.

In the above-mentioned constitution, the refractive index of a semiconductor is different from that of air, so that reflection occurs at an interface therebetween. Assuming that the refractive index of a semiconductor is 3.5, total internal reflection occurs when an angle formed by a normal line with respect to the interface and laser light is 16.6° or more. A mode subjected to total internal reflection has an oscillation threshold current decreased by a mirror loss, compared with the other modes. Therefore, oscillation starts at a low injection current level. Furthermore, since a gain is concentrated in this oscillation mode, oscillation in the other modes is suppressed.

In FIGS. 19A and 19B, on an end facet excluding the laser emitting portion, the angle formed by the normal line with respect to the interface and the laser light is 45°, which satisfies a total internal reflection condition. In the laser emitting portion, a part of the end facet is designed so that the normal line with respect to the interface becomes parallel to laser light. At this time, the oscillation threshold current at room temperature is 5.5 mA with respect to the laser light 4002 and 5 mA with respect to the laser light 4003.

The driving current of the semiconductor ring laser type gyro 4150 is 6.5 mA. When the gyro stands still, the oscillation wavelength λ of the laser light 4002 and that of the laser light 4003 are substantially equal to each other (about 1.55 μm). However, the light intensity of the laser light 4003 is larger than that of the laser light 4002. Therefore, the oscillation frequencies thereof are slightly different. Specifically, an oscillation frequency $f_3$ of the laser light 4003 is larger than an oscillation frequency $f_4$ of the laser light 4002 by 20 kHz. The laser light 4012 and the laser light 4013 emitted from the semiconductor ring laser type gyro 4150 interfere with each other in the photodetector 4030. At this time, a signal with a frequency of 20 kHz is obtained from the photodetector 4030. More specifically, even when the semiconductor ring laser type gyro 4150 stands still, a beat signal can be detected.

When the semiconductor ring laser type gyro 4150 is subjected to rotation in the clockwise direction at a speed of 30° per second (which is substantially equal to hand-shaking of a camera, a vibration of a car), an oscillation frequency $f_3$ of the laser light 4103 in the counterclockwise direction is increased by 88.7 Hz. On the other hand, an oscillation frequency $f_4$ of the laser light 4102 in the clockwise direction is decreased by 88.7 Hz. Thus, the beat frequency $f_3-f_4$ becomes 20 kHz+177.4 Hz.

On the other hand, when the semiconductor ring laser type gyro 4150 is subjected to rotation in the counterclockwise direction at a speed of 30° per second, the beat frequency $f_3-f_4$ becomes 20 kHz−177.4 Hz.

The absolute value of an increase/decrease amount in the beat frequency is proportional to a rotation speed, so that the rotation speed can be detected. In addition to this, the rotation direction and an increase/decrease in the beat frequency have one-to-one correspondence, so that the rotation direction can be detected.

Hitherto, the case has been described in which the beat frequency during a standstill is 20 kHz. When the apparatus for controlling a power source of driving 4 is turned off, the beat signal during a standstill fluctuates by about ±50 Hz, as shown in FIG. 15A. In contrast, when the power source of driving 1 is controlled by the apparatus for controlling a power source of driving 4 after a beat frequency is measured as in the present invention, a beat frequency can be stabilized as shown in FIG. 15B. FIG. 15C shows the diagram in FIG. 15B by enlarging the vertical axis. In FIG. 15C, a frequency fluctuation is suppressed to ±1 Hz or less. This result is obtained by controlling under the condition that the electrodes of the optical waveguides 4001 and 4005 are connected to each other. When the electrodes of the optical waveguides 4001 and 4005 are independently controlled, a frequency fluctuation is reduced to ±0.1 Hz, as shown in FIG. 4B.

Herein, an output signal from the photodetector is used as a beat signal. However, an output signal of the apparatus for controlling a power source of driving 4 containing information on a beat signal, an output current or an output voltage of the power source of driving may be used as a signal for detecting an angular velocity. Furthermore, it is also preferable in terms of enhancement of a signal/noise ratio that at least two of the above-mentioned signal, current and voltage or a signal from the electric terminal of the gyro are used as signals, and statistical processing (an average (including a weighted average) and a difference) is conducted.

In this example, as a semiconductor material, an InGaAsP system has been used. However, any material system such as a GaAs system, a ZnSe system, an InGaN system, and an AlGaN system may be used. Regarding the shape surrounded by an optical path in the optical waveguide, any shape such as a hexagon, a triangle, and a circle, as well as a square as shown in FIGS. 19A and 19B may be used.

Example 11

Figure 20:
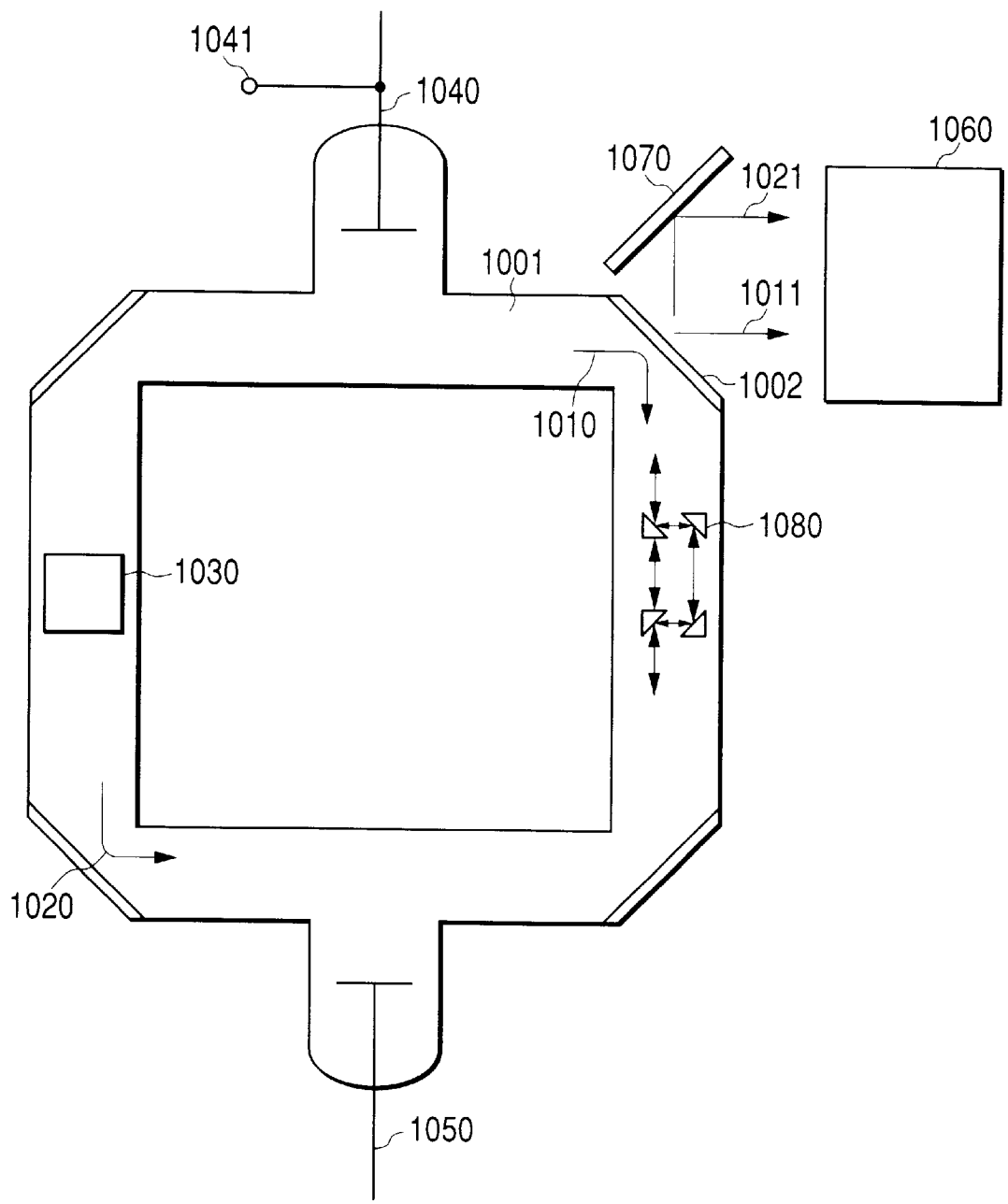
FIG. 20 is a view illustrating a gyro of the eleventh example according to the present invention.

The features of Example 11 are best understood from FIG. 20. FIG. 20 schematically shows a gas ring laser type gyro. In FIG. 20, reference numeral 1011 denotes emitted laser light in the clockwise direction, 1021 denotes emitted laser light in the counterclockwise direction, 1060 denotes a photodetector, and 1070 denotes a mirror. Helium gas and neon gas are introduced into the silica tube 1001, and a voltage is applied between the anode and the cathode, whereby discharge starts and a current starts flowing. In the silica tube 1001, the laser light 1010 in the clockwise direction and the laser light 1020 in the counterclockwise direction oscillate. Since two paths are formed with respect to laser light by using the mirror 1080, thereby constituting a coupled resonator, stable oscillation in a single longitudinal mode can be realized with respect to the laser light in the clockwise direction and the laser light in the counterclockwise direction respectively.

When the gas ring laser type gyro stands still, the oscillation frequency of the laser light 1010 and that of the laser light 1020 are substantially equal to each other (4.37×10$^{14}$ Hz), and an oscillation wavelength λ is 632.8 nm. Since the optical isolator 1030 is inserted into an optical path of laser light, the oscillation threshold current with respect to the laser light 1010 is smaller than that with respect to the laser light 1020. Therefore, the light intensity of the laser light 1010 is larger than that of the laser light 1020. Specifically, an oscillation frequency $f_1$ of the laser light 1010 is larger than an oscillation frequency $f_2$ of the laser light 1020 by 20 MHz. The laser light is allowed to be emitted outside, and the laser light 1011 and the laser light 1021 simultaneously enter the photodetector 1060. In the photodetector 1060, the laser light 1011 and the laser light 1021 interfere with each other. Thus, a signal with a frequency of 20 MHz is obtained from the photodetector 1060. More specifically, even when the gas ring laser type gyro stands still, a beat signal can be detected. When the gas ring laser type gyro is subjected to rotation in the clockwise direction at a speed of 180° per second, and the length of one side of the resonator is 10 cm, the oscillation frequency $f_1$ of the laser light 1010 in the counterclockwise direction is increased by 248.3 kHz. On the other hand, the oscillation frequency $f_2$ of the laser light 1020 in the clockwise direction is decreased by 248.3 kHz. Thus, the beat frequency $f_1-f_2$ becomes 20 MHz+496.6 Hz. When the gas ring laser type gyro is subjected to rotation in the counterclockwise direction at a speed of 180° per second, the beat frequency $f_1-f_2$ becomes 20 MHz−496.6 Hz. The absolute value of an increase/decrease amount in the beat frequency is proportional to a rotation speed, so that the rotation speed can be detected. In addition to this, the rotation direction and an increase/decrease in the beat frequency have one-to-one correspondence, so that the rotation direction can be detected.

In the present example, when the apparatus for controlling a power source of driving 4 is turned off, the beat signal during a standstill fluctuates by about ±100 Hz. In contrast, when the power source of driving 1 is controlled by the apparatus for controlling a power source of driving 4 after measuring the beat frequency as in the present invention, a frequency fluctuation is suppressed to ±1 Hz or less.

Furthermore, an output signal of the apparatus for controlling a power source of driving 4 containing information on a beat signal, an output current or an output voltage of the power source of driving may be used as a signal for detecting an angular velocity. Furthermore, it is also preferable in terms of enhancement of a signal/noise ratio that at least two of the above-mentioned signal, current and voltage or a signal from the electric terminal of the gyro are used as signals, and statistical processing (an average (including a weighted average) and a difference) is conducted.

Herein, although helium gas and neon gas are used, any gas may be used as long as it allows a laser to oscillate. Regarding the shape surrounded by an optical path in the optical waveguide, any shape such as a hexagon, a triangle, and a circle, as well as a square as shown in FIG. 20 may be used.

As described above, according to the present invention, a ring laser and a ring laser type gyro can be provided, which are capable of restricting the number of oscillation modes without causing lock-in. A ring laser type gyro can be realized, which is capable of stably detecting a rotation direction and a rotation speed with good precision without using a mechanism such as a dither, while restricting the number of oscillation modes.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A ring laser comprising multiple ring resonators with different optical path lengths, wherein at least part of the multiple ring resonators are optically coupled,
    wherein laser lights which are counterpropagating and have different oscillation frequencies are present in each of the ring resonators, and
    wherein a difference in the oscillation frequencies of the laser lights is increased with respect to one rotation direction of the ring laser and is decreased with respect to the other rotation direction of the ring laser.

2. A ring laser according to claim 1, wherein at least part of the multiple ring resonators is provided with a portion for giving a loss difference or a net gain difference with respect to the counterpropagating laser light.

3. A ring laser according to claim 2, wherein the portion for giving a loss difference is a taper-shaped optical waveguide having an asymmetric shape.

4. A ring laser according to claim 2, wherein the portion for giving a loss difference or a net gain difference includes a polarizer.

5. A ring laser according to any one of claims 1 or 3 to 5, wherein each of the ring resonators is provided with an electrode for electrically and independently controlling at least part of the ring resonator.

6. A ring laser according to claim 1, wherein at least one of the ring resonators has only laser light propagating in one propagating direction therein.

7. A ring laser according to claim 6, wherein at least one of the ring resonators includes a mechanism for giving a loss difference or a net gain difference with respect to laser lights counterpropagating in the ring resonator.

8. A ring laser according to claim 7, wherein the mechanism for giving a loss difference or a net gain difference with respect to laser lights counterpropagating in the ring resonator is a taper-shaped optical waveguide.

9. A ring laser according to claim 7, wherein the mechanism for giving a loss difference of a net gain difference with respect to laser lights counterpropagating in the ring resonator is composed of an optical component including a polarizer.

10. A ring laser according to any one of claims 8 to 9, further comprising multiple electrodes capable of electrically and independently controlling at least part of multiple paths.

11. A ring laser according to claim 10, wherein at least part of said multiple electrodes is electrically and independently controlled.

12. A gyro apparatus comprising:
    a ring laser comprising multiple ring resonators with different optical path lengths, wherein at least part of the multiple ring resonators are optically coupled;
    a power source for driving the ring laser;
    an apparatus for measuring a difference in oscillation frequency of laser light; and
    an apparatus for controlling the power source in accordance with the difference in oscillation frequencies,
        wherein each of said multiple ring resonators has a portion for propagating laser lights which are counterpropagating and have different oscillation frequencies,
        wherein a difference in the oscillation frequencies of the laser lights is increased with respect to one rotation direction of the ring laser and is decreased with respect to the other rotation direction of the ring laser.

13. A gyro apparatus according to claim 12, further comprising an apparatus for measuring the difference in oscillation frequencies of laser lights counterpropagating in an optical resonator from a change in a current, a voltage, or impedance of the ring laser.

14. A gyro apparatus according to claim 12, further comprising: a photodetector for simultaneously receiving laser lights counterpropagating in the optical resonator; and an apparatus for measuring the difference in oscillation frequencies of the laser lights from an output of the photodetector.

15. A gyro apparatus according to claim 12, further comprising:
    an apparatus for measuring the difference in oscillation frequencies of laser lights counterpropagating in the optical resonator from a change in a current, a voltage, or impedance of the ring laser;
    a photodetector for simultaneously receiving the laser lights counterpropagating in the optical resonator; and
    an apparatus for measuring the difference in oscillation frequencies of the laser lights from an output of the photodetector.

16. A gyro apparatus according to claim 12, further comprising a frequency-voltage conversion circuit.

17. A gyro apparatus according to claim 12, further comprising a frequency counter.

18. A method for driving a gyro apparatus including a ring laser, comprising the steps of:
    driving a power source for supplying power to the ring laser;
    controlling the power source so that a difference in oscillation frequencies of laser lights becomes constant,
        wherein the ring laser comprises multiple ring resonators with different optical path lengths, wherein at least part of the multiple ring resonators are optically coupled, wherein the laser lights conterpropagating and having different oscillation frequencies are present in each of the ring resonators, wherein a difference in the oscillation frequencies of the laser lights is increased with respect to one rotation direction of the ring lase and is decreased with respect to the other rotation direction of the ring laser.

19. A method for driving a gyro apparatus according to claim 18, wherein the power source supplies an electric power to multiple electrodes of the ring laser.

20. A method for driving a gyro apparatus according to claim 19, wherein the power source supplies an electric power to at least part of multiple electrodes of the ring laser so that the electrodes are electrically independent from each other.

21. A method for detecting a rotation direction of a gyro apparatus including a ring laser, comprising the steps of;

driving a power source which supplies power to the ring laser;

taking at least one of a signal corresponding to change in a current, a voltage or impedance of the ring laser, an output of a photodetector which simultaneously receives laser lights counterpropagating in an optical resonator, a signal for controlling the power source, and an output current or an output voltage of the power source;

using the signal as a difference in the oscillation frequencies of the laser lights of a gyro; and detecting a rotation direction based on the signal, wherein the ring laser comprises multiple ring resonators with different optical path lengths, wherein at least part of the multiple ring resonators are optically coupled, wherein laser lights counterpropagating and having different oscillation frequencies are present in each of the ring resonators, wherein the difference in the oscillation frequencies of the laser lights is increased with respect to one rotation direction of the ring laser and is decreased with respect to the other rotation direction of the ring laser.

22. A signal detection method of a gyro apparatus according to claim 21, wherein multiple signals of a change in a current, a voltage or impedance of the ring laser, an output of the photodetector, a signal for controlling the power source of driving, and an output current or an output voltage of the power source of driving are subjected to statistical processing, and an obtained signal is used as an output signal of a gyro.

* * * * *

UNITED STATES PATENT AND TRADEMARK OFFICE
CERTIFICATE OF CORRECTION

PATENT NO. : 6,658,039 B2
DATED : December 2, 2003
INVENTOR(S) : Numai

It is certified that error appears in the above-identified patent and that said Letters Patent is hereby corrected as shown below:

Column 1,
Line 31, "High" should read -- Hei --.

Column 10,
Line 67, "A" should read -- An --.

Column 19,
Line 64, "signal," should read -- signals, --.

Column 21,
Line 53, "claims 1 or 3 to 5," should read -- claims 1 to 4. --.

Column 23,
Line 6, "lase" should read -- laser --.

Signed and Sealed this

Twenty-fifth Day of January, 2005

JON W. DUDAS
*Director of the United States Patent and Trademark Office*